(12) United States Patent
Hatakeyama et al.

(10) Patent No.: US 7,569,323 B2
(45) Date of Patent: Aug. 4, 2009

(54) RESIST PROTECTIVE COATING MATERIAL AND PATTERNING PROCESS

(75) Inventors: Jun Hatakeyama, Joetsu (JP); Yuji Harada, Joetsu (JP); Yoshio Kawai, Joetsu (JP); Masayuki Endo, Kadoma (JP); Masaru Sasago, Kadoma (JP); Haruhiko Komoriya, Kawagoe (JP); Michitaka Ootani, Kawagoe (JP); Satoru Miyazawa, Kawagoe (JP); Kazuhiko Maeda, Tokyo (JP)

(73) Assignees: Shin-Etsu Chemical Co., Ltd., Tokyo (JP); Panasonic Corporation, Kadoma-Shi (JP); Central Glass Co., Ltd., Ube-Shi (JP)

( * ) Notice: Subject to any disclaimer, the term of this patent is extended or adjusted under 35 U.S.C. 154(b) by 198 days.

(21) Appl. No.: 11/492,957

(22) Filed: Jul. 26, 2006

(65) Prior Publication Data
US 2007/0026341 A1    Feb. 1, 2007

(30) Foreign Application Priority Data
Jul. 27, 2005   (JP)   .............. 2005-216832

(51) Int. Cl.
*G03F 7/30*   (2006.01)
(52) U.S. Cl. .............. 430/270.1; 430/326; 430/330; 430/905; 430/907; 430/910; 526/281; 526/284
(58) Field of Classification Search .............. 430/270.1, 430/905, 910, 326, 330, 907; 526/281, 284
See application file for complete search history.

(56) References Cited

U.S. PATENT DOCUMENTS

| | | | |
|---|---|---|---|
| 5,541,037 A | | 7/1996 | Hatakeyama et al. |
| 6,548,219 B2 * | 4/2003 | Ito et al. ................... 430/270.1 |
| 6,710,148 B2 * | 3/2004 | Harada et al. ................ 526/245 |
| 6,861,197 B2 * | 3/2005 | Harada et al. ............. 430/270.1 |
| 6,933,095 B2 * | 8/2005 | Harada et al. ............. 430/270.1 |
| 7,029,822 B2 * | 4/2006 | Hasegawa et al. ......... 430/270.1 |
| 7,067,231 B2 * | 6/2006 | Harada et al. ............. 430/270.1 |
| 2002/0058198 A1 * | 5/2002 | Klauck-Jacobs et al. . 430/270.1 |
| 2002/0161148 A1 * | 10/2002 | Harada et al. ................ 526/242 |
| 2003/0157430 A1 * | 8/2003 | Yoon et al. ................ 430/270.1 |

FOREIGN PATENT DOCUMENTS

| | | |
|---|---|---|
| JP | 60-38821 A | 2/1985 |
| JP | 62-62520 A | 3/1987 |
| JP | 62-62521 A | 3/1987 |
| JP | 5-74700 A | 3/1993 |
| JP | 6-273926 A | 9/1994 |
| JP | 2803549 B2 | 9/1998 |

OTHER PUBLICATIONS

Soichi Owa et al.; "Immersion lithography; its potential performance and issues", Proceedings of SPIE, vol. 5040, pp. 724-733; 2003. Cited in the specification.
Taku Hirayama; "Resist and Cover Material Investigation for Immersion Lithography"; 2$^{nd}$. Immersion Workshop, Jul. 11, 2003. Cited in the specification.
Robert D. Allen et al.; "Design of Protective Topcoats for Immersion Lithography"; Journal of Photopolymer Science and Technology, vol. 18, No. 5, pp. 615-619, 2005.

* cited by examiner

*Primary Examiner*—John S Chu
(74) *Attorney, Agent, or Firm*—Westerman, Hattori, Daniels & Adrian, LLP.

(57) ABSTRACT

A resist protective coating material is provided comprising an α-trifluoromethylacrylic acid/norbornene copolymer having cyclic perfluoroalkyl groups as pendant. In a pattern-forming process, the material forms on a resist film a protective coating which is water-insoluble, dissolvable in alkaline developer and immiscible with the resist film, allowing for effective implementation of immersion lithography.

20 Claims, No Drawings

RESIST PROTECTIVE COATING MATERIAL AND PATTERNING PROCESS

CROSS-REFERENCE TO RELATED APPLICATION

This non-provisional application claims priority under 35 U.S.C. §119(a) on Patent Application No. 2005-216832 filed in Japan on Jul. 27, 2005, the entire contents of which are hereby incorporated by reference.

TECHNICAL FIELD

This invention generally relates to a micropatterning process for the fabrication of semiconductor devices, and particularly to an immersion photolithography process involving directing ArF excimer laser radiation having a wavelength of 193 nm from a projection lens toward a wafer, with water intervening between the lens and the wafer. More particularly, it relates to a resist protective coating material used as a resist overlay for protecting photoresist and a process for forming a resist pattern using the same.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used. One means believed effective for further reducing the feature size is to reduce the wavelength of exposure light. For the mass production process of 64 M-bit dynamic random access memory (DRAM, processing feature size 0.25 µm or less), the exposure light source of i-line (365 nm) was replaced by a KrF excimer laser having a shorter wavelength of 248 nm. However, for the fabrication of DRAM with a degree of integration of 256 M and 1 G or more requiring a finer patterning technology (processing feature size 0.2 µm or less), a shorter wavelength light source is required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE Vol. 5040, p724).

Several problems associated with the presence of water on resist were pointed out. For example, profile changes occur because the acid once generated from a photoacid generator and the amine compound added to the resist as a quencher can be dissolved in water. The pattern collapses due to swelling. It was then proposed to provide a protective coating between the resist and water (see the 2nd Immersion Workshop, Jul. 11, 2003, Resist and Cover Material Investigation for Immersion Lithography).

In the lithography history, the protective coating on the resist layer was studied as an antireflective coating. For example, the antireflective coating on resist (ARCOR) process is disclosed in JP-A 62-62520, JP-A 62-62521, and JP-A 60-38821. The ARCOR process involves forming a transparent antireflective coating on top of a resist film and stripping it after exposure. Despite its simplicity, the process can form a micropattern at a high degree of definition, precision and alignment. When the antireflective coating is made of perfluoroalkyl compounds (e.g., perfluoroalkyl polyethers or perfluoroalkyl amines) having a low refractive index, the light reflection at the resist/antireflective coating interface is minimized so that the dimensional precision is improved. In addition to these materials, the fluorinated materials proposed thus far include amorphous polymers such as perfluoro(2,2-dimethyl-1,3-dioxol)-tetrafluoroethylene copolymers and cyclic polymers of perfluoro(allyl vinyl ether) and perfluorobutenyl vinyl ether as disclosed in JP-A 5-74700.

Because of their low compatibility with organic substances, the foregoing perfluoroalkyl compounds must be diluted with fluorocarbon solvents such as Freon for controlling a coating thickness. As is well known in the art, the use of fluorocarbons now raises an issue from the standpoint of environmental protection. The perfluoroalkyl compounds are awkward to form uniform films, and are not regarded satisfactory as antireflective films. Additionally, the antireflective films must be stripped with fluorocarbon solvents prior to the development of photoresist. These factors lead to many practical disadvantages including a need to add an antireflective film-stripping unit to the existing system and the increased cost of fluorocarbon solvents.

If the antireflective film is to be stripped without adding an extra unit to the existing system, it is most desirable to carry out stripping in the development unit. The solutions used in the photoresist development unit are an alkaline aqueous solution as the developer and deionized water as the rinse. It would be desirable to have an antireflective coating material which can be readily stripped with such solutions. For this reason, there were proposed a number of water-soluble antireflective coating materials and patterning processes using the same. See, for example, JP-A 6-273926 and Japanese Patent No. 2,803,549.

The water-soluble protective coatings, however, cannot be used in the immersion lithography because they are dissolved away in water during light exposure. On the other hand, water-insoluble fluoro-polymers pose a need for special fluorocarbon strippers and an exclusive stripping cup for fluorocarbon solvents. It was thus desired to have a resist protective coating which is water insoluble, but can be readily stripped.

A topcoat material based on methacrylate having hexafluoroalcohol pendants and dissolvable in a liquid developer is described in J. Photopolymer Sci. and Technol., Vol. 18, No. 5, p615 (2005). This material has a high Tg of 150° C., high alkali solubility and good compatibility with resists.

SUMMARY OF THE INVENTION

An object of the invention is to provide a resist protective coating material which is best suited for the immersion lithography in that it enables effective pattern formation by the immersion lithography, it can be removed simultaneously with a photoresist layer during development, and it has improved process compatibility; and a pattern forming process using the same.

The inventors have discovered that when a film of a polymer having repeat units of the general formula (1), shown below, is formed on a resist film as a resist protective coating, this protective coating (or resist overlay) is insoluble in water, excellent in sliding action to water, dissolvable in alkali aqueous solution by copolymerizing the above units having the general formula (1) with repeat units having a carboxyl group or α-fluoroalcohol group, and immiscible with the resist film, so that it can be simultaneously stripped altogether during development of the resist film in alkaline water or stripped by an organic solvent before development. This protective coating has a wider range of process applicability.

In one aspect, the invention provides a resist protective coating material comprising a polymer comprising repeat units (A) and/or (B) having the general formula (1).

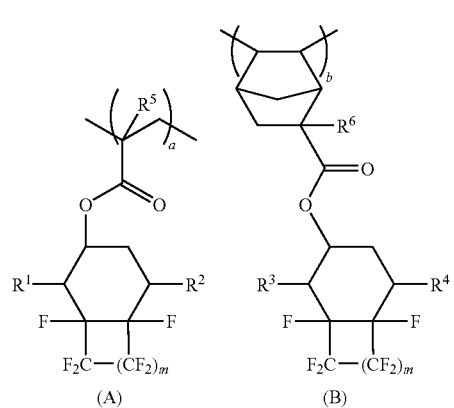

Herein $R^1$ to $R^4$ are hydrogen, or a pair of $R^1$ and $R^2$ and a pair of $R^3$ and $R^4$, taken together, form a methylene or ethylene group, $R^5$ is fluorine or trifluoromethyl, $R^6$ is hydrogen, methyl, fluorine, or trifluoromethyl, the subscripts m and n each are an integer of 1 to 3, a and b are numbers in the range: $0 \leq a \leq 1$, $0 \leq b \leq 1$, and $0 < a+b \leq 1$.

In one preferred embodiment, the polymer further has copolymerized therein repeat units (C) having alkali-soluble groups selected from carboxyl groups and α-fluoroalcohol groups of the general formula (2).

Herein $R^7$ and $R^8$ are hydrogen, methyl, fluorine, or trifluoromethyl, either one of $R^7$ and $R^8$ contains at least one fluorine atom.

In another preferred embodiment, the polymer further has copolymerized therein repeat units (D) having fluoroalkyl groups, in addition to repeat units (A) and/or (B) and optional repeat units (C).

Typically, the resist protective coating material further contains a solvent in which the polymer is dissolved.

In another aspect, the invention provides a lithography process for forming a pattern, comprising the steps of forming a photoresist layer on a wafer, forming a protective coating on the photoresist layer from a resist overlay material, exposing the layer structure to light, and developing, wherein the resist overlay material is the resist protective coating material defined above.

In a further aspect, the invention provides an immersion lithography process for forming a pattern, comprising the steps of forming a photoresist layer on a wafer, forming a protective coating on the photoresist layer from a resist overlay material, exposing the layer structure in water to light, and developing, wherein the resist overlay material is the resist protective coating material defined above. Preferably, the exposing step includes exposing the layer structure to light having a wavelength in the range of 180 to 250 nm through a projection lens while keeping water between the projection lens and the wafer. In a preferred embodiment, the developing step is to develop the photoresist layer and strip the protective coating of resist overlay material at the same time, using a liquid alkaline developer. Alternatively, the process may further comprise the step of stripping the protective coating using an organic solvent after the exposing step, and then developing the photoresist layer using a liquid alkaline developer.

BENEFITS OF THE INVENTION

In the pattern-forming process of the invention, since the protective coating formed on the resist film is water-insoluble, dissolvable in alkali aqueous solution or alkaline developer and immiscible with the resist film, the immersion lithography can be conducted in a satisfactory manner. During alkali development, both development of the resist film and removal of the protective coating can be simultaneously achieved. In an embodiment wherein alkali-soluble groups are not copolymerized, a solvent strippable protective coating is obtained.

DESCRIPTION OF THE PREFERRED EMBODIMENTS

The invention addresses the immersion lithography process for forming a pattern by forming a photoresist layer on a wafer, forming a protective coating on the photoresist layer from a resist overlay material, exposing the layer structure in water to light, and developing. The resist protective coating material of the invention is best suited as the resist overlay material and characterized by comprising a polymer comprising repeat units of the general formula (1), specifically repeat units (A) of the general formula (1a) and repeat units (B) of the general formula (1b):

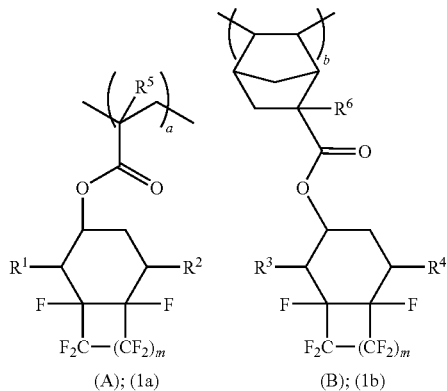

wherein $R^1$ to $R^4$ are hydrogen, or a pair of $R^1$ and $R^2$ and a pair of $R^3$ and $R^4$, taken together, form a methylene or ethylene group, $R^5$ is fluorine or trifluoromethyl, $R^6$ is hydrogen, methyl, fluorine, or trifluoromethyl, the subscripts m and n each are an integer of 1 to 3, a and b are numbers in the range: $0 \leq a \leq 1$, $0 \leq b \leq 1$, and $0 < a+b \leq 1$.

Examples of the monomers from which repeat units (A) and (B) of formula (1) are derived are illustrated below.

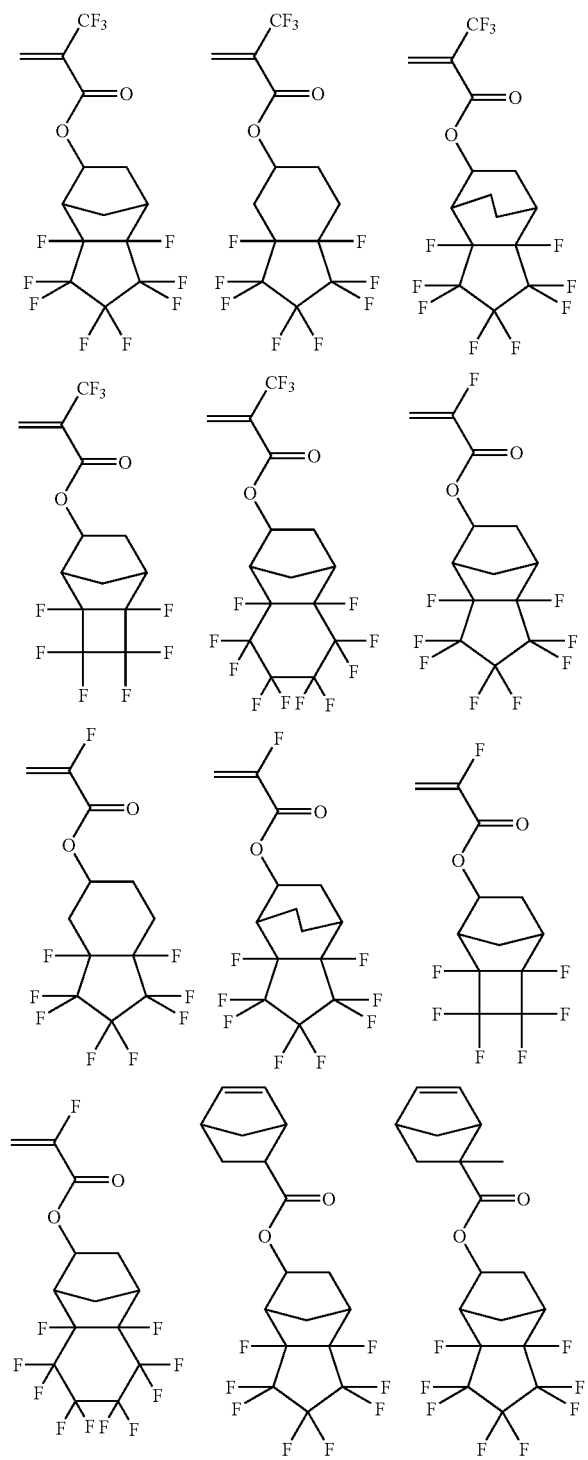

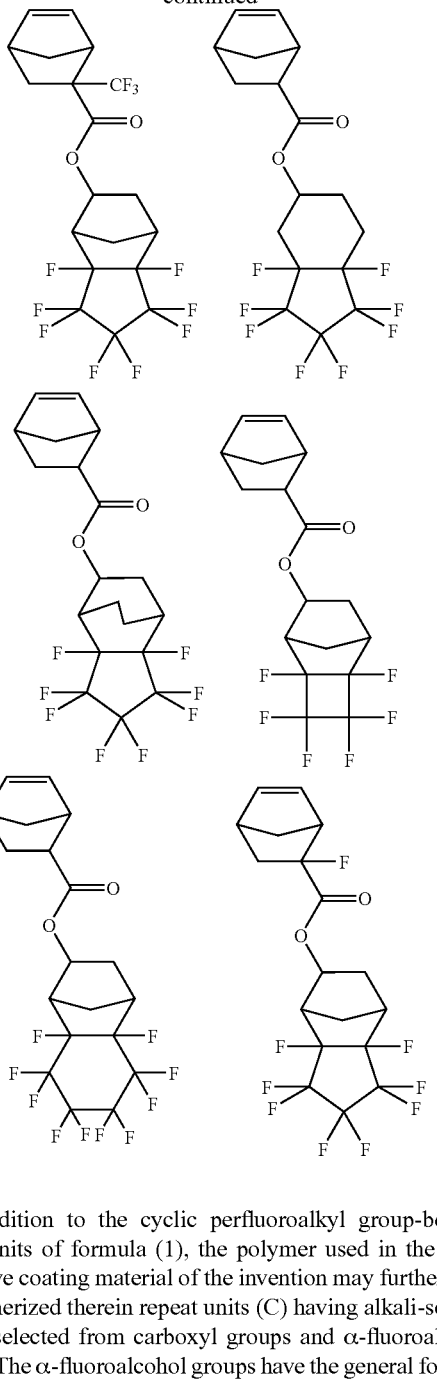

In addition to the cyclic perfluoroalkyl group-bearing repeat units of formula (1), the polymer used in the resist protective coating material of the invention may further have copolymerized therein repeat units (C) having alkali-soluble groups selected from carboxyl groups and α-fluoroalcohol groups. The α-fluoroalcohol groups have the general formula (2):

$$\left[ \begin{array}{c} R^7 \\ | \\ -C-OH \\ | \\ R^8 \end{array} \right] \quad (2)$$

wherein $R^7$ and $R^8$ are hydrogen, methyl, fluorine, or trifluoromethyl, either one of $R^7$ and $R^8$ contains at least one fluorine atom.

Examples of the monomers from which repeat units (C) having alkali-soluble groups selected from carboxyl groups and α-fluoroalcohol groups are derived are illustrated below.
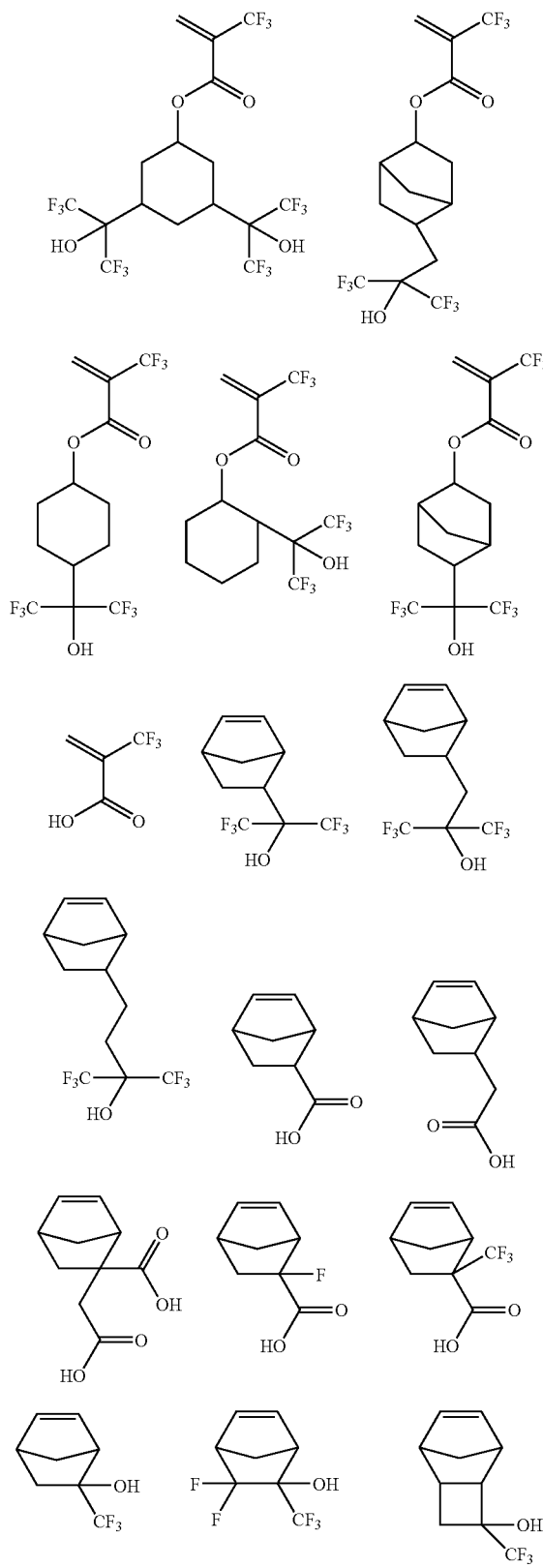
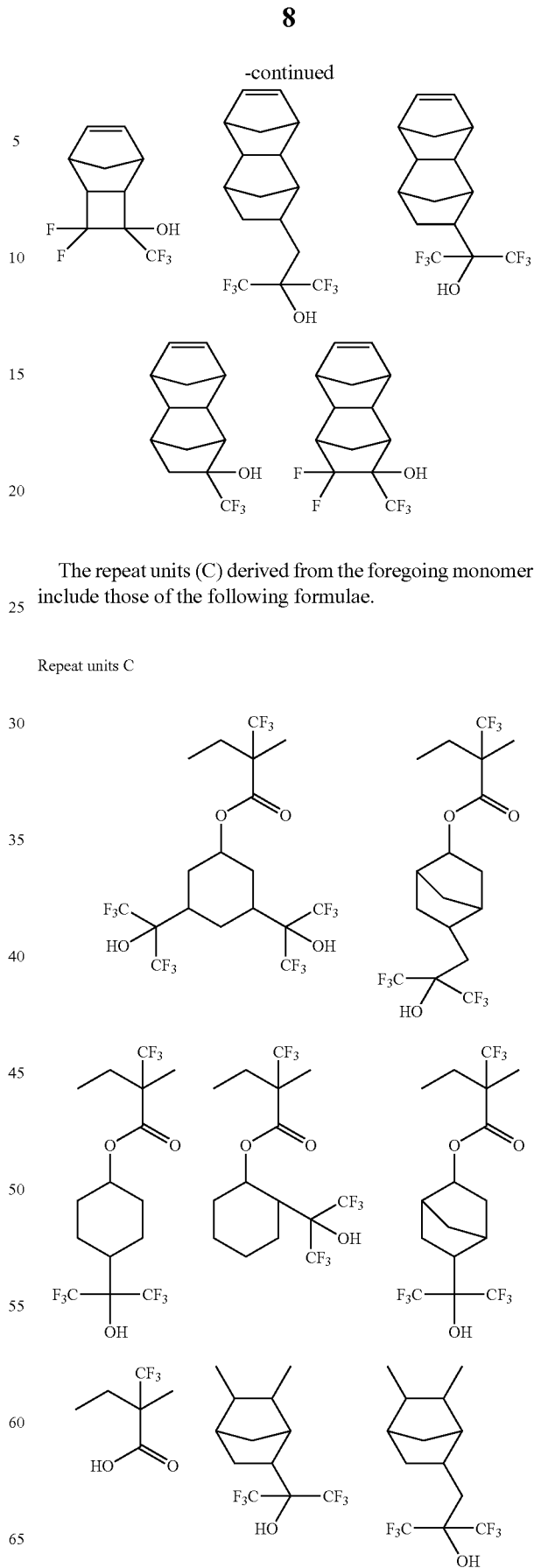
The repeat units (C) derived from the foregoing monomers include those of the following formulae.
Repeat units C -continued

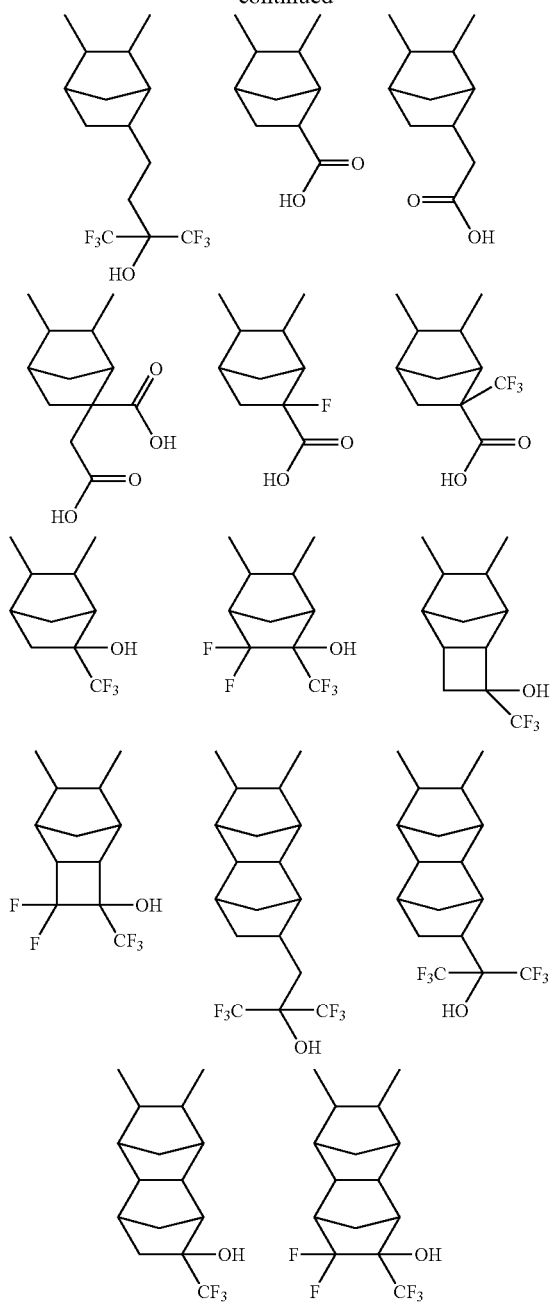

Using a polymer having water-repellent repeat units (A) and/or (B) of formula (1) and alkali-soluble repeat units (C) copolymerized, a resist protective coating can be formed having a dissolution rate of up to 0.1 angstrom per second (Å/s) in water and a dissolution rate of at least 300 Å/s in a developer which is a 2.38 wt % aqueous solution of tetramethylammonium hydroxide (TMAH). In an embodiment wherein a polymer consists essentially of repeat units (A) and (B) and is free of alkali-soluble groups, the polymer forms a solvent strippable resist protective coating.

For preventing intermixing with the resist film, the polymer may have further copolymerized therein repeat units (D) having fluoroalkyl groups.

Examples of the monomers from which repeat units (D) having fluoroalkyl groups are derived are illustrated below.

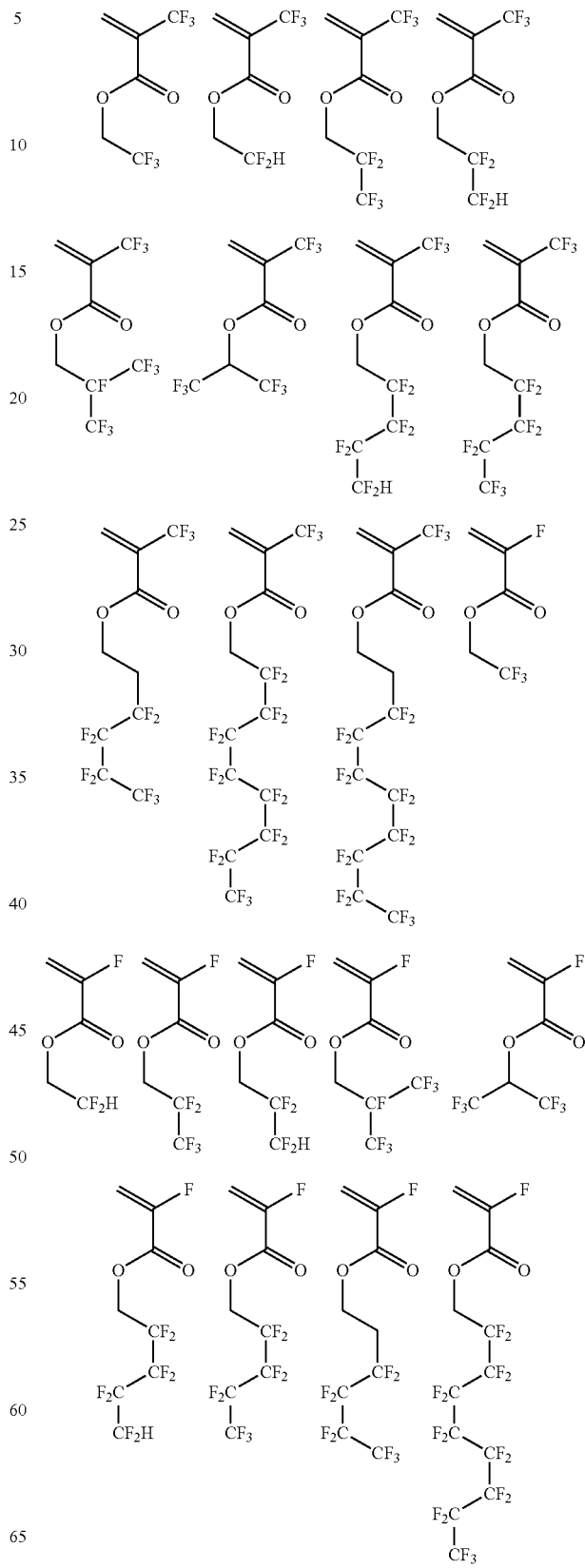

-continued
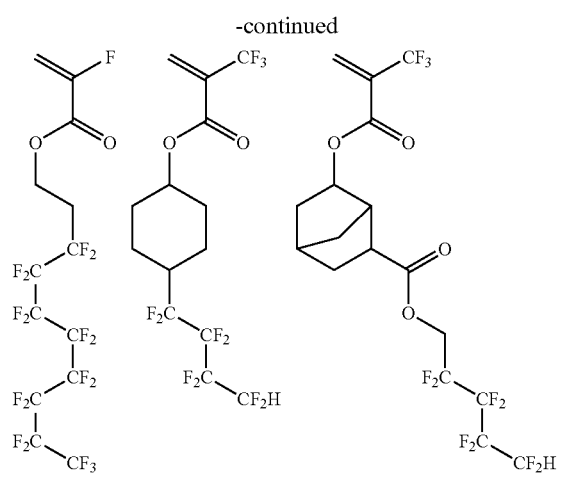
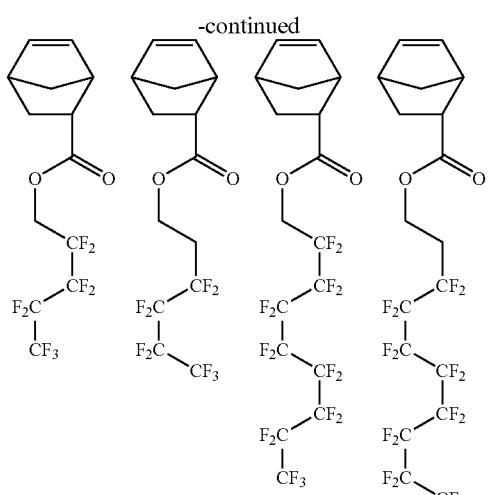
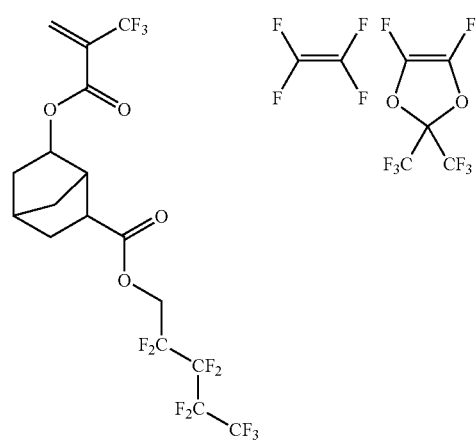
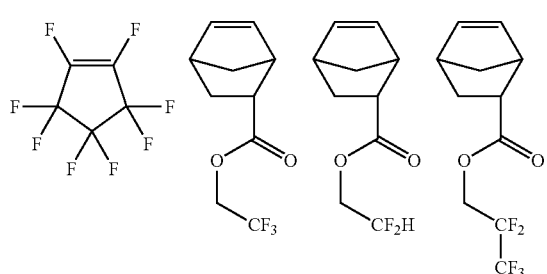
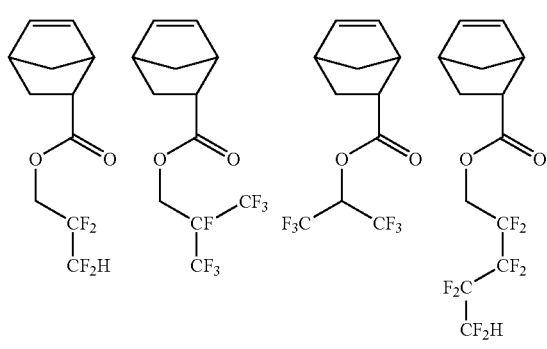
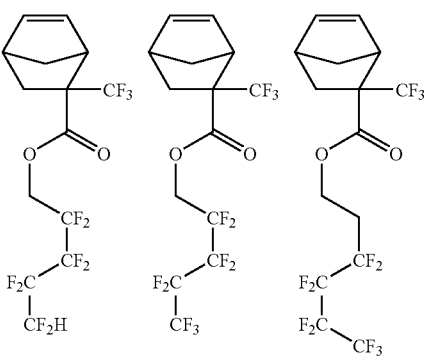

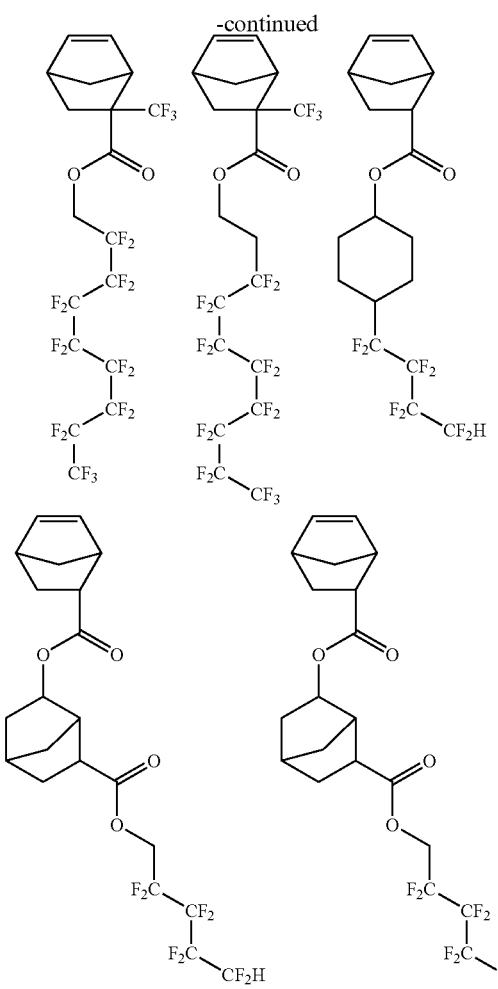
The repeat units (D) derived from the foregoing monomers include those of the following formulae.
Repeat units D
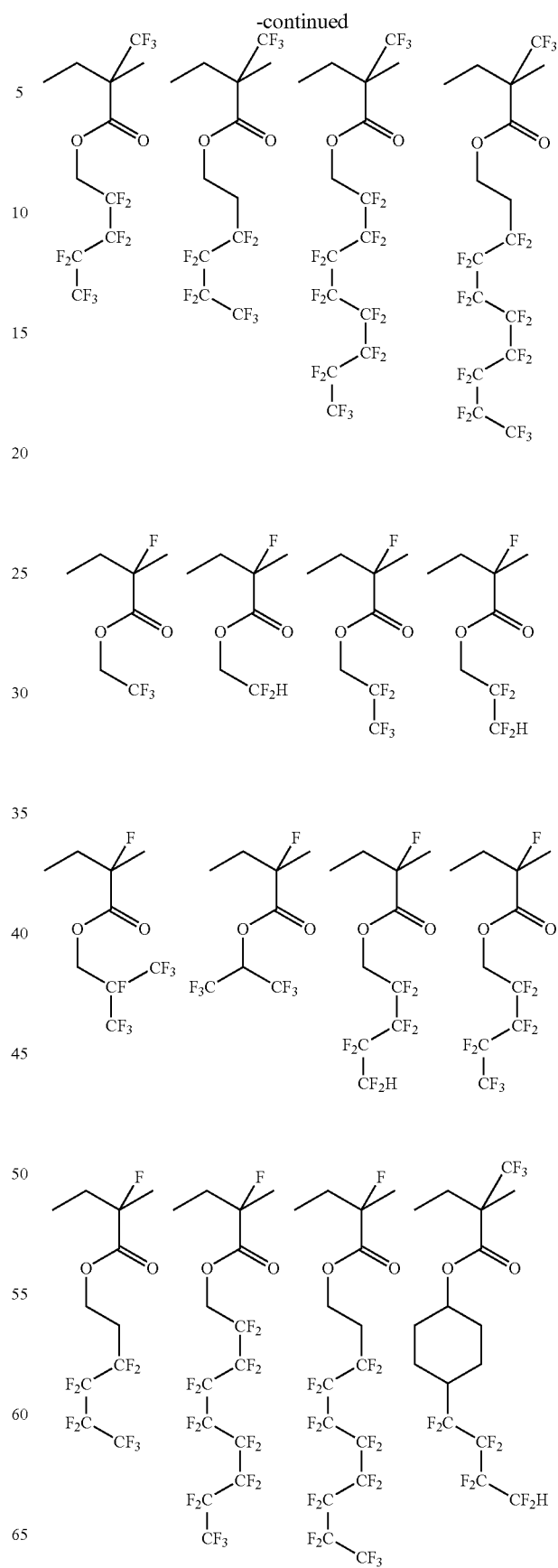

-continued
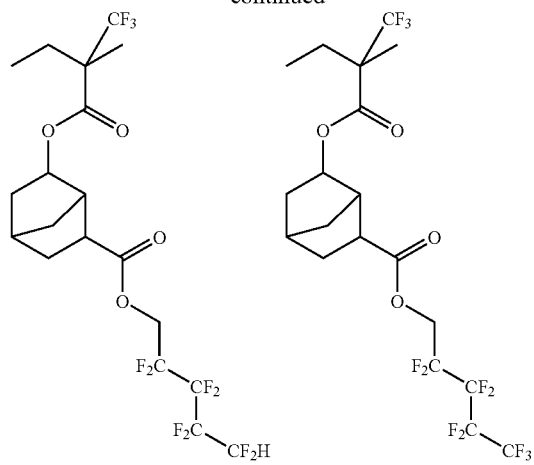
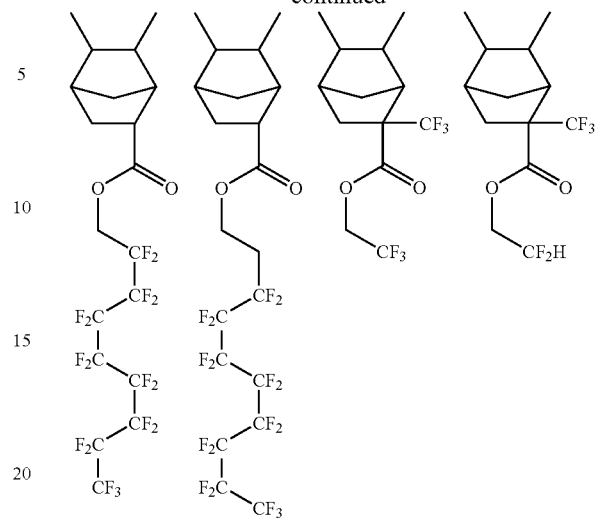
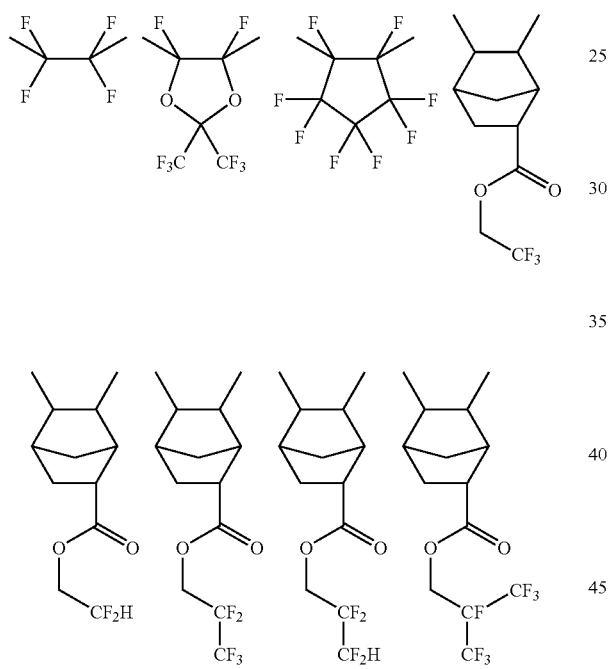
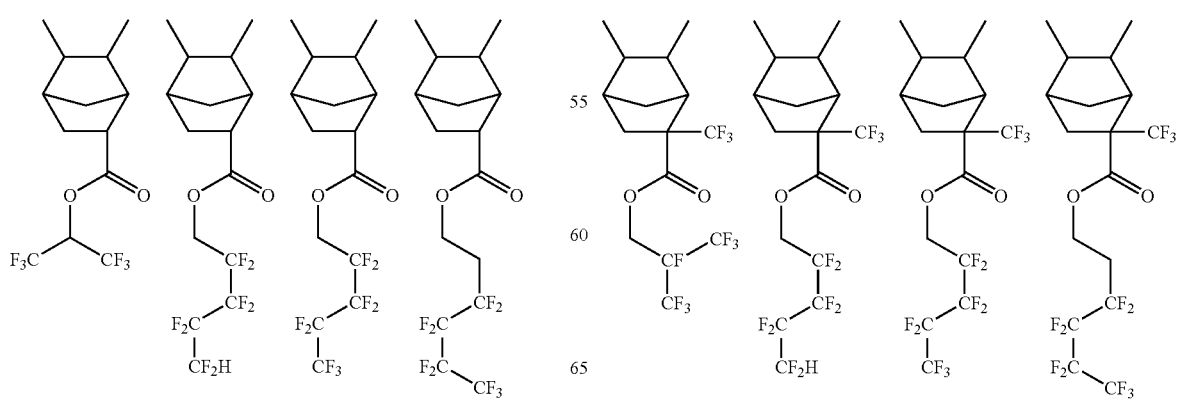

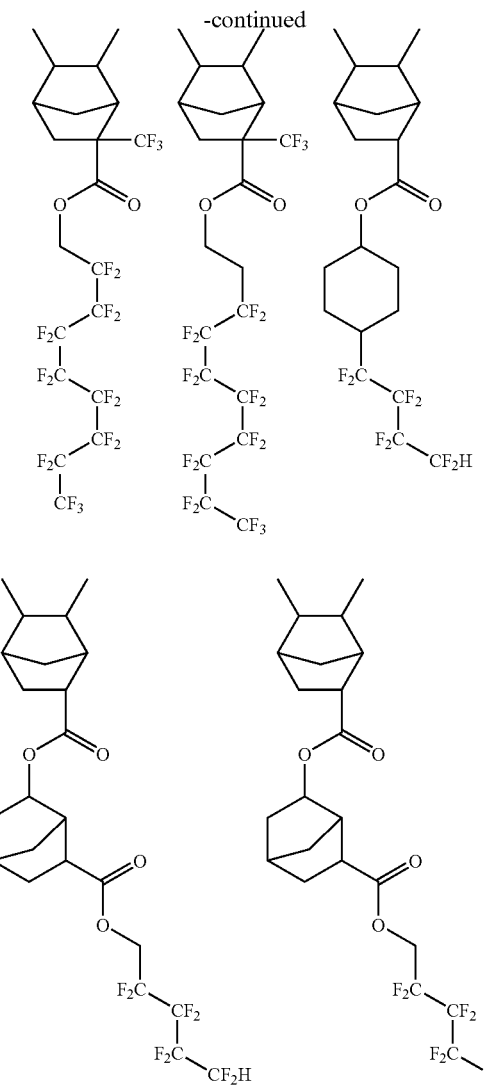

In the polymer, the repeat units (A), (B), (C), and (D) are included in proportions a, b, c, and d in the range: $0 \leq a \leq 1.0$, $0 \leq b \leq 1.0$, $0 < a+b \leq 1.0$, $0 \leq c \leq 0.9$, and $0 \leq d \leq 0.9$; and preferably $0 \leq a \leq 0.8$, $0 \leq b \leq 0.8$, $0.1 \leq a+b \leq 0.8$, $0 \leq c \leq 0.6$, and $0 \leq d \leq 0.8$, provided that $a+b+c+d=1$.

More particularly, in one embodiment wherein the polymer consists of repeat units (A) having formula (1a) and repeat units (B) having formula (1b) in proportions a and b, provided that $a+b=1$, a and b are in the range: $0 \leq a \leq 1$ and $0 \leq b \leq 1$, preferably $0 \leq a \leq 0.9$ and $0 \leq b \leq 0.9$, more preferably $0 \leq a \leq 0.8$ and $0 \leq b \leq 0.8$;

in another embodiment wherein the polymer contains repeat units (C) in addition to repeat units (A) and (B), the proportions a, b and c of repeat units (A), (B) and (C), provided that $a+b+c=1$, are in the range: $0 \leq a < 1$, $0 \leq b < 1$, $0 < a+b < 1$, and $0 < c < 1$, preferably $0 \leq a \leq 0.9$, $0 \leq b \leq 0.9$, $0.1 \leq a+b \leq 0.9$, and $0.1 \leq c \leq 0.9$, more preferably $0 \leq a \leq 0.8$, $0 \leq b \leq 0.8$, $0.1 \leq a+b \leq 0.8$, and $0.2 \leq c \leq 0.8$;

in a further embodiment wherein the polymer contains repeat units (D) in addition to repeat units (A), (B) and (C), the proportions a, b, c and d of repeat units (A), (B), (C) and (D), provided that $a+b+c+d=1$, are in the range: $0 \leq a < 1$, $0 \leq b < 1$, $0 < a+b < 1$, $0 < c \leq 0.9$, and $0 < d \leq 0.9$, preferably $0 \leq a \leq 0.9$, $0 \leq a+b \leq 0.9$, $0.1 \leq +b \leq 0.9$, $0.1 \leq c \leq 0.9$, and $0.1 \leq d \leq 0.9$, more preferably $0 \leq a \leq 0.8$, $0 \leq b \leq 0.8$, $0.1 \leq a+b \leq 0.8$, $0.1 \leq c \leq 0.8$, and $0.1 \leq d \leq 0.8$.

The meaning of $a+b+c+d=1$ is that in a polymer comprising repeat units (A), (B), (C), and (D), the total of proportions a, b, c, and d of the corresponding repeat units is 100 mol% based on the total amount of entire repeat units.

The polymers of the invention should preferably have a weight average molecular weight (Mw) of 1,000 to 500,000, more preferably 2,000 to 30,000, as determined by gel permeation chromatography (GPC) versus polystyrene standards. A polymer with too low a Mw may be miscible with the resist material or dissolvable in water whereas too high a Mw may interfere with film formation after spin coating and lead to a decline of alkali solubility.

The polymers may be synthesized by any desired method, for example, by dissolving unsaturated bond-containing monomers corresponding to the respective repeat units (A), (B), (C), and (D) in an organic solvent, adding a radical initiator thereto, and effecting heat polymerization. Examples of the organic solvent which can be used for polymerization include toluene, benzene, tetrahydrofuran, diethyl ether, dioxane, methanol, ethanol and isopropanol. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours.

The α-trifluoromethylacrylic acid/norbornene copolymers having cyclic perfluoroalkyl groups as pendant groups according to the invention have a very high glass transition temperature (Tg) which is higher than analogous methacrylate copolymers. High Tg is advantageous in preventing intermixing with the resist film.

In the practice of the invention, the polymer is dissolved in a suitable solvent to form a solution which is ready for use as the resist protective coating material. For film formation by spin coating technique, the solvent is preferably used in such amounts to provide a polymer concentration of 0.1 to 20% by weight, more preferably 0.5 to 10% by weight.

The solvent used herein is not particularly limited although those solvents in which resist layers can be dissolved should be avoided. It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Suitable solvents in which resist layers are not dissolvable include nonpolar solvents, for example, higher alcohols of at least 4 carbon atoms, toluene, xylene, anisole, hexane, cyclohexane and ethers. Inter alia, higher alcohols of at least 4 carbon atoms are preferred. Examples include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, methyl cyclopentyl ether and methyl cyclohexyl ether.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

Also useful are solvents having the following general formula (3).

In formula (3), $R^{11}$ and $R^{12}$ are hydrogen, or straight or branched alkyl groups of 1 to 10 carbon atoms, either one or both of $R^{11}$ and $R^{12}$ contain at least one fluorine atom, and $R^{10}$ is a straight or branched alkylene group of 2 to 5 carbon atoms.

Examples of the solvent having formula (3) are given below.

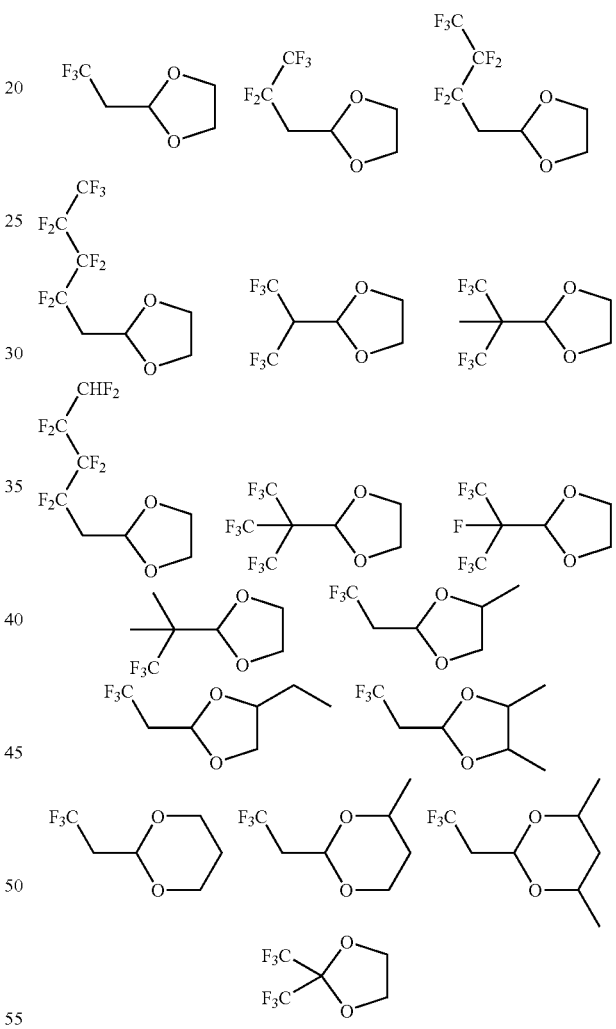

These solvents may be used as a spin coating medium and as a stripping solvent for a solvent-strippable protective coating.

Stripping with the solvent may be performed before or after the post-exposure baking (PEB). In one exemplary stripping technique, the stripping solvent is dispensed onto a rotating wafer from a nozzle located at the center of the wafer. In the case of stripping before PEB, a problem arises if the stripping solvent is left after the treatment. During PEB, not only the residual stripping solvent, but also the acid in the resist evaporates off. Then deblocking reaction does not take place in the areas where the acid has evaporated, and no pattern is formed after development, forming defects. To prevent such a problem, after dispensing of the solvent, it should be fully removed by spin drying or vacuum drying. In the case of stripping after PEB, there is a possibility of intermixing between the resist and the protective coating during PEB. Since low molecular weight components such as monomers left in the polymer of the protective coating may become a cause of intermixing, it is important to remove low molecular weight components following polymerization.

The lithography pattern forming process of the invention involves the steps of forming a photoresist layer on a wafer, forming a protective coating on the photoresist layer from a resist overlay material, exposing the layer structure to light, and developing. The process is characterized in that the resist overlay material is the water-insoluble, alkali-soluble resist protective coating material defined above.

Specifically, first the water-insoluble, alkali-soluble resist overlay material is applied to a photoresist layer on a wafer by suitable techniques, typically spin coating. The coating thickness is preferably in a range of 10 to 500 nm. The lithography used herein may be either dry lithography wherein a gas such as air or nitrogen is present between the resist protective coating and the projection lens, or immersion lithography wherein a liquid fills in between the resist protective coating and the projection lens. The immersion lithography favors water. In the immersion lithography, whether or not the wafer edge and rear side are cleaned and the cleaning technique are important in preventing flowing of water to the wafer rear side and leaching from the substrate. After spin coating, the resist protective coating is baked at a temperature of 40 to 130° C. for 10 to 300 seconds for evaporating off the solvent. In the case of resist layer formation and dry lithography, edge cleaning is performed during the spin coating. In the case of immersion lithography, contact of water with the substrate surface which is fully hydrophilic is undesirable because water may be left on the substrate surface at the edge. It is then recommended to omit edge cleaning during the spin coating of the resist protective coating.

Once the resist protective coating is formed, light exposure in water is carried out by KrF or ArF immersion lithography. This is followed by post-exposure bake (PEB) and development in an alkaline developer for 10 to 300 seconds. An aqueous solution of 2.38 wt % tetramethylammonium hydroxide, which is commonly used as the alkaline developer, is used herein whereby stripping of the resist protective coating and development of the resist layer are simultaneously effected. Sometimes water is left on the resist protective coating prior to PEB. If PEB is performed in the presence of residual water, water can penetrate through the protective coating to suck up the acid in the resist, impeding pattern formation. To fully remove the water on the protective coating prior to PEB, the water on the protective coating should be dried or recovered by suitable means, for example, spin drying prior to PEB, purging of the protective coating surface with dry air or nitrogen, or optimizing the water recovery nozzle configuration or process on a stage after the exposure. Additionally, the resist protective coating of the invention has high water repellency and thus offers the advantage of efficient water recovery.

The type of photoresist material is not particularly limited. The photoresist may be either positive or negative working and also either a monolayer resist of conventional hydrocarbon or a bilayer resist containing silicon atoms and the like. For KrF lithography resist materials, the preferred base resins are polyhydroxystyrene or polyhydroxystyrene-(meth)acrylate copolymers in which hydrogen atoms of hydroxyl or carboxyl groups are replaced by acid labile groups.

For ArF lithography resist materials, the base resin must have an aromatic-free structure. Illustrative polymers include polyacrylic acid and derivatives thereof, norbornene derivative-maleic anhydride alternating copolymers and ternary or quaternary copolymers thereof with polyacrylic acid or derivatives thereof, tetracyclododecene derivative-maleic anhydride alternating copolymers and ternary or quaternary copolymers thereof with polyacrylic acid or derivatives thereof, norbornene derivative-maleimide alternating copolymers and ternary or quaternary copolymers thereof with polyacrylic acid or derivatives thereof, tetracyclododecene derivative-maleimide alternating copolymers and ternary or quaternary copolymers thereof with polyacrylic acid or derivatives thereof, and polynorbornene and metathesis ring-opening polymers, and a combination of any.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Monomers 1 to 9 used in Synthesis Examples are identified below by their structural formula.

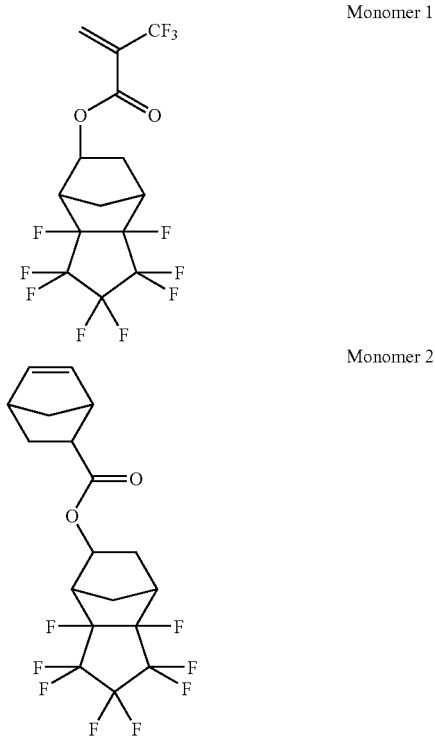

Monomer 1

Monomer 2

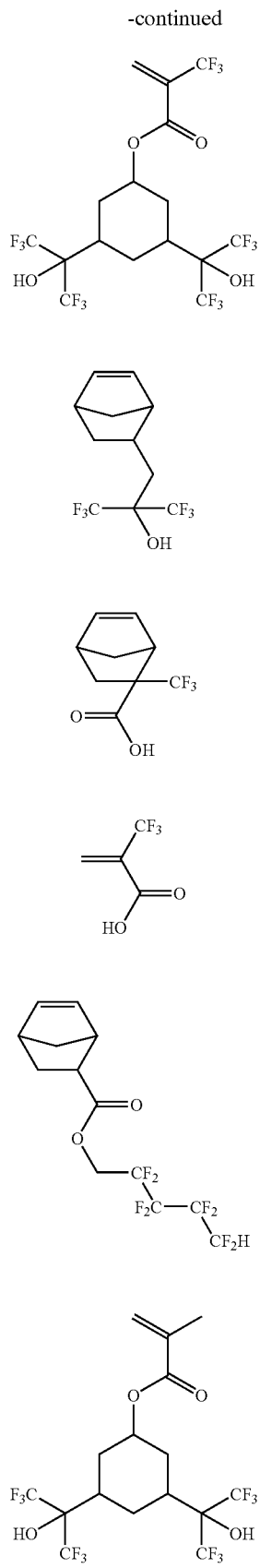
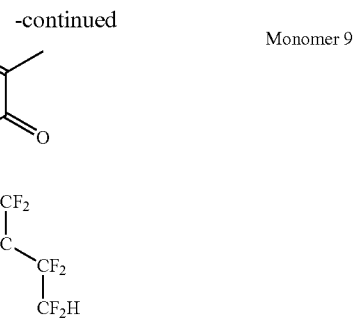

Monomer 3

Monomer 4

Monomer 5

Monomer 6

Monomer 7

Monomer 8

Monomer 9

Synthesis Example 1

A 200-ml flask was charged with 12.5 g of Monomer 1, 22 g of Monomer 3, 9.2 g of Monomer 4, and 40 g of methanol as a solvent. The reactor was cooled to −70° C. in a nitrogen atmosphere, followed by vacuum evacuation and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 1, was analyzed for composition by $^1$H-NMR and for molecular weight by GPC.

Inventive Polymer 1
Mw 8,200
Mw/Mn 1.78

Synthesis Example 2

A 200-ml flask was charged with 38.7 g of Monomer 3, 13.3 g of Monomer 2, and 40 g of methanol as a solvent. The reactor was cooled to −70° C. in a nitrogen atmosphere, followed by vacuum evacuation and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 2, was analyzed for composition by $^1$H-NMR and for molecular weight by GPC.

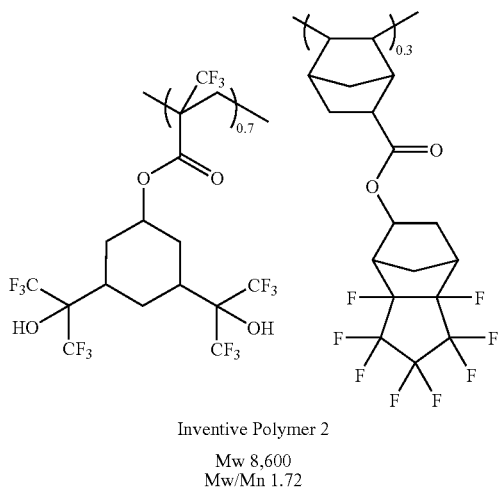

Inventive Polymer 2
Mw 8,600
Mw/Mn 1.72

Synthesis Example 3

A 200-ml flask was charged with 30.4 g of Monomer 3, 2.2 g of Monomer 6, 13.3 g of Monomer 2, and 40 g of methanol as a solvent. The reactor was cooled to –70° C. in a nitrogen atmosphere, followed by vacuum evacuation and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 3, was analyzed for composition by $^1$H-NMR and for molecular weight by GPC.

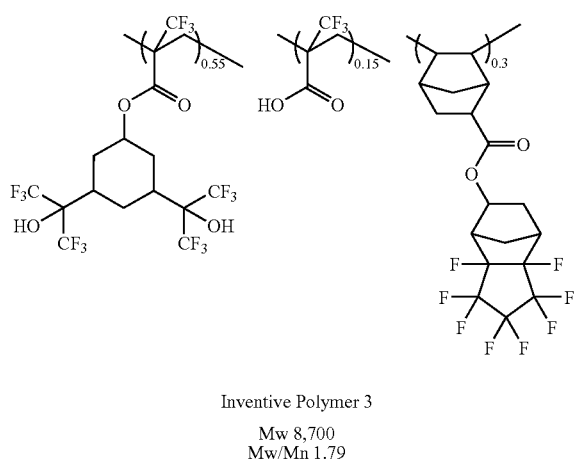

Inventive Polymer 3
Mw 8,700
Mw/Mn 1.79

Synthesis Example 4

A 200-ml flask was charged with 38.7 g of Monomer 3, 9.2 g of Monomer 2, 2.3 g of Monomer 5, and 40 g of methanol as a solvent. The reactor was cooled to –70° C. 0 in a nitrogen atmosphere, followed by vacuum evacuation and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 4, was analyzed for composition by $^1$H-NMR and for molecular weight by GPC.

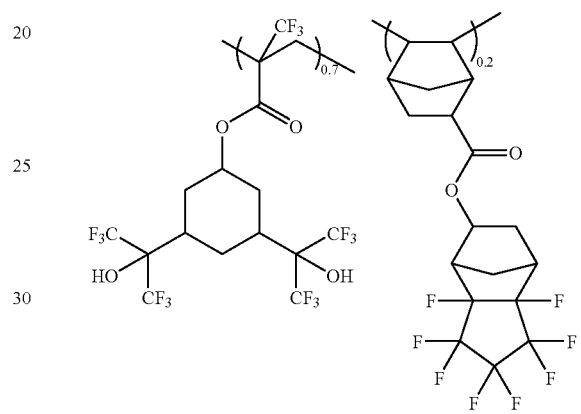

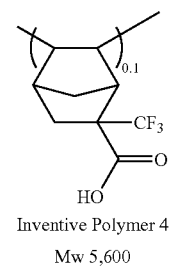

Inventive Polymer 4
Mw 5,600
Mw/Mn 1.46

Synthesis Example 5

A 200-ml flask was charged with 38.7 g of Monomer 3, 9.2 g of Monomer 2, 4.2 g of Monomer 7, and 40 g of methanol as a solvent. The reactor was cooled to –70° C. in a nitrogen atmosphere, followed by vacuum evacuation and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 5, was analyzed for composition by $^1$H-NMR and for molecular weight by GPC.

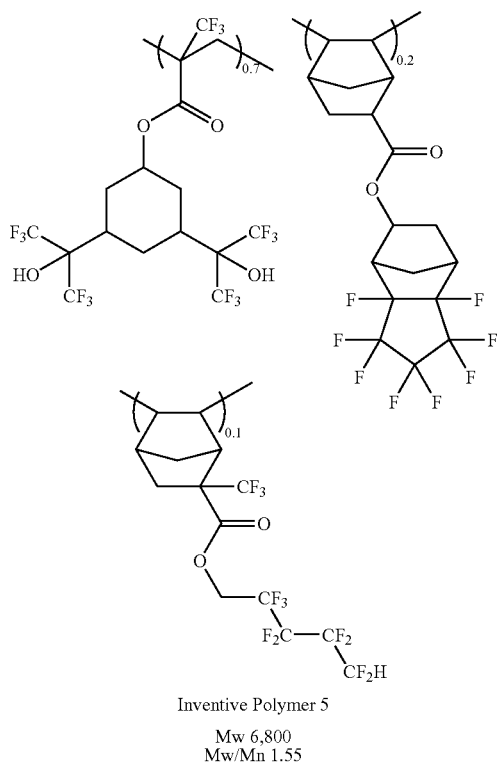

Inventive Polymer 5
Mw 6,800
Mw/Mn 1.55

Synthesis Example 6

A 200-ml flask was charged with 31.3 g of Monomer 1, 12.5 g of Monomer 2, and 40 g of tetrahydrofuran as a solvent. The reactor was cooled to −70° C. in a nitrogen atmosphere, followed by vacuum evacuation and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 6, was analyzed for composition by $^1$H-NMR and for molecular weight by GPC.

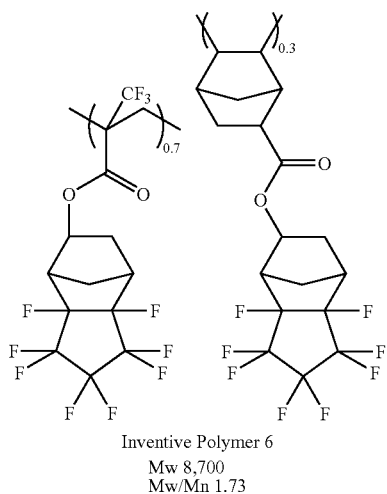

Inventive Polymer 6
Mw 8,700
Mw/Mn 1.73

Comparative Synthesis Example 1

A 200-ml flask was charged with 35 g of Monomer 8, 9 g of Monomer 9, and 60 g of methanol as a solvent. The reactor was cooled to −70° C. in a nitrogen atmosphere, followed by vacuum evacuation and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Comparative Polymer 1, was analyzed for composition by $^1$H-NMR and for molecular weight by GPC.

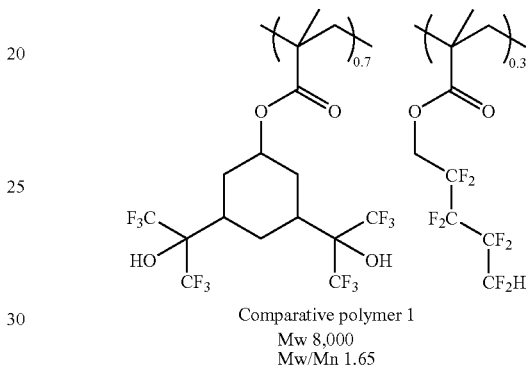

Comparative polymer 1
Mw 8,000
Mw/Mn 1.65

Inventive Polymers 1 to 6 and Comparative Polymer 1 in powder form were measured for glass transition temperature (Tg) using a differential scanning calorimeter DSC8230 (Rigaku Denki K.K.). The results are shown in Table 1.

TABLE 1

| Protective coating polymer | Tg (° C.) |
|---|---|
| Inventive Polymer 1 | 144 |
| Inventive Polymer 2 | 152 |
| Inventive Polymer 3 | 168 |
| Inventive Polymer 4 | 175 |
| Inventive Polymer 5 | 142 |
| Inventive Polymer 6 | 165 |
| Comparative Polymer 1 | 105 |

Higher Tg suggests less intermixing with the resist film during baking, offering the advantage of the resist pattern undergoing less changes after development.

Resist protective coating solutions were prepared by dissolving each 0.5 g of Inventive Polymers 1 to 5 and Comparative Polymer 1 in 25 g of isobutylalcohol or 0.5 g of Inventive Polymer 6 in 20 g of a fluorinated solvent 1 of the structural formula shown below and filtering through a polypropylene filter having a pore size of 0.2 μm. The resist protective coating solutions were spin coated onto silicon wafers which had been treated with hexamethyldisilazane (HMDS) and baked at 100° C. for 60 seconds to form protective coatings of 50 nm thick. The wafers on which the resist protective coatings had been formed by the above procedure were rinsed with deionized water for 5 minutes. A change of coating thickness was examined. The results are shown in Table 2.

TABLE 2

| Protective coating polymer | Coating thickness change before and after rinsing (nm) |
|---|---|
| Inventive Polymer 1 | 0 |
| Inventive Polymer 2 | 0 |
| Inventive Polymer 3 | 0 |
| Inventive Polymer 4 | 0 |
| Inventive Polymer 5 | 0 |
| Inventive Polymer 6 | 0 |
| Comparative Polymer 1 | 0 |

The wafers on which the resist protective coatings of Inventive Polymers 1 to 5 and Comparative Polymer 1 had been formed by the above procedure were developed with a 2.38 wt % tetramethylammonium hydroxide (TMAH) aqueous solution for 30 seconds. The coatings as developed were measured for thickness. In the case of solvent-strippable resist protective coating of Inventive Polymer 6, the fluorinated solvent 1 was flowed over the wafer for 10 seconds while the wafer was rotated at 500 rpm. It was then spin dried at 2,000 rpm for 20 seconds before the coating thickness was measured. The results are shown in Table 3.

TABLE 3

| Protective coating polymer | Coating thickness after development (nm) |
|---|---|
| Inventive Polymer 1 | 0 |
| Inventive Polymer 2 | 0 |
| Inventive Polymer 3 | 0 |
| Inventive Polymer 4 | 0 |
| Inventive Polymer 5 | 0 |
| Inventive Polymer 6 | 0 |
| Comparative Polymer 1 | 0 |

While the wafers on which the resist protective coatings had been formed by the above procedure were kept horizontal, 50 μL of deionized water was dropped to form a droplet. The wafers were gradually inclined and the angle at which the droplet started sliding down was determined. The results are shown in Table 4.

TABLE 4

| Protective coating polymer | Sliding angle (°) |
|---|---|
| Inventive Polymer 1 | 18 |
| Inventive Polymer 2 | 16 |
| Inventive Polymer 3 | 20 |
| Inventive Polymer 4 | 21 |
| Inventive Polymer 5 | 17 |
| Inventive Polymer 6 | 10 |
| Comparative Polymer 1 | 24 |

A smaller sliding angle indicates an easier flow of water on the coating and hence, a higher scanning speed during scan exposure. The polymers within the scope of the invention are characterized by a smaller sliding angle.

Next, a resist solution was prepared by dissolving 5 g of a resist polymer, shown below, 0.25 g of a photoacid generator PAG, shown below, and 0.3 g of triethanolamine as a quencher in 55 g of propylene glycol monoethyl ether acetate (PGMEA) and filtering through a polypropylene filter having a pore size of 0.2 μm. An antireflective coating ARC-29A (Nissan Chemical Co., Ltd.) was formed on a silicon substrate to a thickness of 87 nm. The resist solution was applied onto the antireflective coating and baked at 110° C. for 60 seconds, forming a resist film of 150 nm thick. The resist protective coating solution was applied onto the resist film and baked at 100° C. for 60 seconds. In order to simulate immersion lithography, light exposure was followed by rinsing of the coating with deionized water for 5 minutes. The structure was exposed by means of an ArF scanner model S307E (Nikon Corp., NA 0.85, σ0.93, 4/5 annular illumination, 6% halftone phase shift mask), rinsed for 5 minutes while splashing deionized water, post-exposure baked (PEB) at 125° C. for 60 seconds, and developed with a 2.38 wt % TMAH aqueous solution for 60 seconds.

In the case of solvent-strippable resist protective coating of Inventive Polymer 6, after PEB and water rinsing, the fluorinated solvent 1 was flowed over the wafer for 10 seconds while the wafer was rotated at 500 rpm. It was then spin dried at 2,000 rpm for 20 seconds before it was developed with a 2.38 wt % TMAH aqueous solution for 60 seconds.

In the absence of the protective coating, a similar process including light exposure, water rinsing, PEB and development was carried out; and a conventional process excluding water rinsing after exposure was also carried out.

The wafers were sectioned for comparing the profile of 75-nm line-and-space pattern and sensitivity. The results are shown in Table 5.

TABLE 5

Resist polymer
Mw 7,200
Mw/Mn 1.88

PAG

Fluorinated solvent 1

| Protective coating polymer | Sensitivity, 75 nm pattern profile |
|---|---|
| no protective coating, conventional process excluding rinsing after exposure | 35 mJ/cm$^2$, rectangular |
| Inventive Polymer 1 | 35 mJ/cm$^2$, rectangular |
| Inventive Polymer 2 | 35 mJ/cm$^2$, rectangular |
| Inventive Polymer 3 | 35 mJ/cm$^2$, rectangular |
| Inventive Polymer 4 | 35 mJ/cm$^2$, rectangular |
| Inventive Polymer 5 | 35 mJ/cm$^2$, rectangular |
| Inventive Polymer 6 | 35 mJ/cm$^2$, rectangular |
| no protective coating | 37 mJ/cm$^2$, T-top |
| Comparative Polymer 1 | 35 mJ/cm$^2$, slimming |

When exposure was followed by water rinsing in the absence of the protective coating, the pattern profile became T-top, probably because the acid once generated was dissolved in water. In contrast, when the protective coating was used according to the invention, the pattern profile remained unchanged. In the event the protective coating was formed of a methacrylate base polymer, the resist layer after development was slimmed.

Japanese Patent Application No. 2005-216832 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist protective coating material comprising a polymer comprising repeat units (A) and/or (B) having the general formula (1):

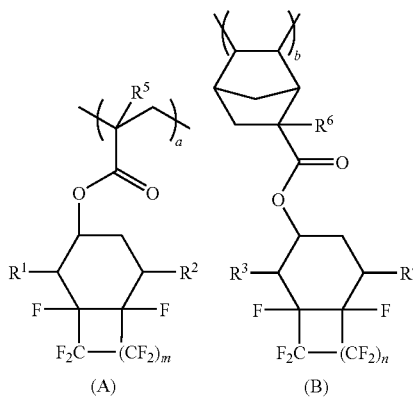

wherein $R^1$ to $R^4$ are hydrogen, or a pair of $R^1$ and $R^2$ and a pair of $R^3$ and $R^4$, taken together, form a methylene or ethylene group, $R^5$ is fluorine or trifluoromethyl, $R^6$ is hydrogen, methyl, fluorine, or trifluoromethyl, and the subscripts m and n each are an integer of 1 to 3, and repeat unit having alkali-soluble groups in the form of α-fluoroalcohol groups of the general formula (2):

wherein $R^7$ and $R^8$ are hydrogen, methyl, fluorine, or trifluoromethyl, either one of $R^7$ and $R^8$ contains at least one fluorine atom, the repeat units (A), (B) and (C) being included in proportions a, b, and c in the range:
$0 \leq a < 1.0$,
$0 \leq b < 1.0$,
$0 < c < 1.0$ and
$0 < a+b < 1$.

2. The resist protective coating material of claim 1 wherein said polymer further has copolymerized therein repeat units (D) having fluoroalkyl groups.

3. The resist protective coating material of claim 1, further comprising a solvent in which said polymer is dissolved.

4. A lithography process for forming a pattern, comprising the steps of forming a photoresist layer on a wafer, forming a protective coating on the photoresist layer from a resist overlay material, exposing the layer structure to light, and developing, said resist overlay material being the resist protective coating material of claim 1.

5. An immersion lithography process for forming a pattern, comprising the steps of forming a photoresist layer on a wafer, forming a protective coating on the photoresist layer from a resist overlay material, exposing the layer structure in water to light, and developing, said resist overlay material being the resist protective coating material of claim 1.

6. The process of claim 5 wherein the exposing step includes exposing the layer structure to light having a wavelength in the range of 180 to 250 nm through a projection lens while keeping water between the projection lens and the wafer.

7. The process of claim 5, wherein the developing step is to develop the photoresist layer and strip the protective coating of resist overlay material at the same time, using a liquid alkaline developer.

8. The process of claim 5, further comprising the step of stripping the protective coating using an organic solvent after the exposing step, and then developing the photoresist layer using a liquid alkaline developer.

9. A lithography process for forming a pattern, comprising the steps of forming a photoresist layer on a wafer, forming a protective coating on the photoresist layer from a resist overlay material, exposing the layer structure to light, and developing, said resist overlay material being a resist protective coating material comprising a polymer comprising repeat units (A) and/or (B) having the general formula (1);

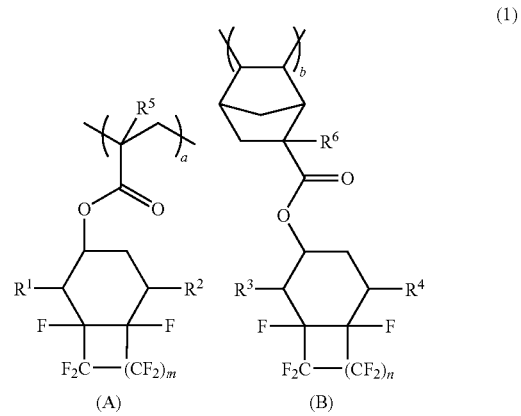

wherein $R^1$ to $R^4$ are hydrogen, or a pair of $R^1$ and $R^2$ and a pair of $R^3$ and $R^4$, taken together, form a methylene or ethylene group, $R^5$ is fluorine or trifluoromethyl, $R^6$ is hydrogen, methyl, fluorine, or trifluoromethyl, the subscripts m and n each are an integer of 1 to 3, and repeat units (C) having alkali-soluble groups in the form of α-fluoroalcohol groups of the general formula (2):

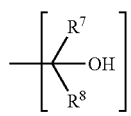

wherein $R^7$ and $R^8$ are hydrogen, methyl, fluorine, or trifluoromethyl, either one of $R^7$ and $R^8$ contains at least one fluorine atom, the repeat units (A), (B), and (C) being included in proportions a, b and c in the range:
$0 \leq a < 1.0$,
$0 \leq b < 1.0$,
$0 < c < 1.0$ and
$0 < a+b < 1$.

10. The process of claim 9 wherein said polymer further has copolymerized therein repeat units (D) having fluoroalkyl groups.

11. An immersion lithography process for forming a pattern, comprising the steps of forming a photoresist layer on a wafer, forming a protective coating on the photoresist layer from a resist overlay material, exposing the layer structure in water to light, and developing, said resist overlay material being a resist protective coating material comprising a polymer comprising repeat units (A) and/or (B) having the general formula (1):

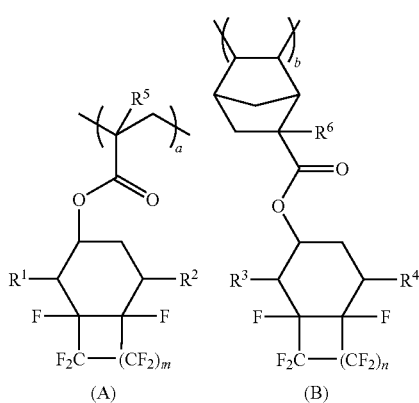

wherein $R^1$ to $R^4$ are hydrogen, or a pair of $R^1$ and $R^2$ and a pair of $R^3$ and $R^4$, taken together, form a methylene or ethylene group, $R^5$ is fluorine or trifluoromethyl, $R^6$ is hydrogen, methyl, fluorine, or trifluoromethyl, the subscripts m and n each are an integer of 1 to 3, a and b are numbers in the range: $0 \leq a \leq 1, 0 \leq b \leq 1$, and $0 < a+b \leq 1$.

12. The process of claim 11 wherein said polymer further has copolymerized therein repeat units (C) having alkali-soluble groups selected from carboxyl groups and α-fluoroalcohol groups of the general formula (2):

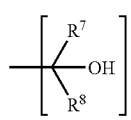

wherein $R^7$ and $R^8$ are hydrogen, methyl, fluorine, or trifluoromethyl, either one of $R^7$ and $R^8$ contains at least one fluorine atom.

13. The process of claim 11 wherein said polymer further has copolymerized therein repeat units (D) having fluoroalkyl groups.

14. The resist protective coating material of claim 1 wherein the repeat unit (C) is selected from the group consisting of units having the following formulae:

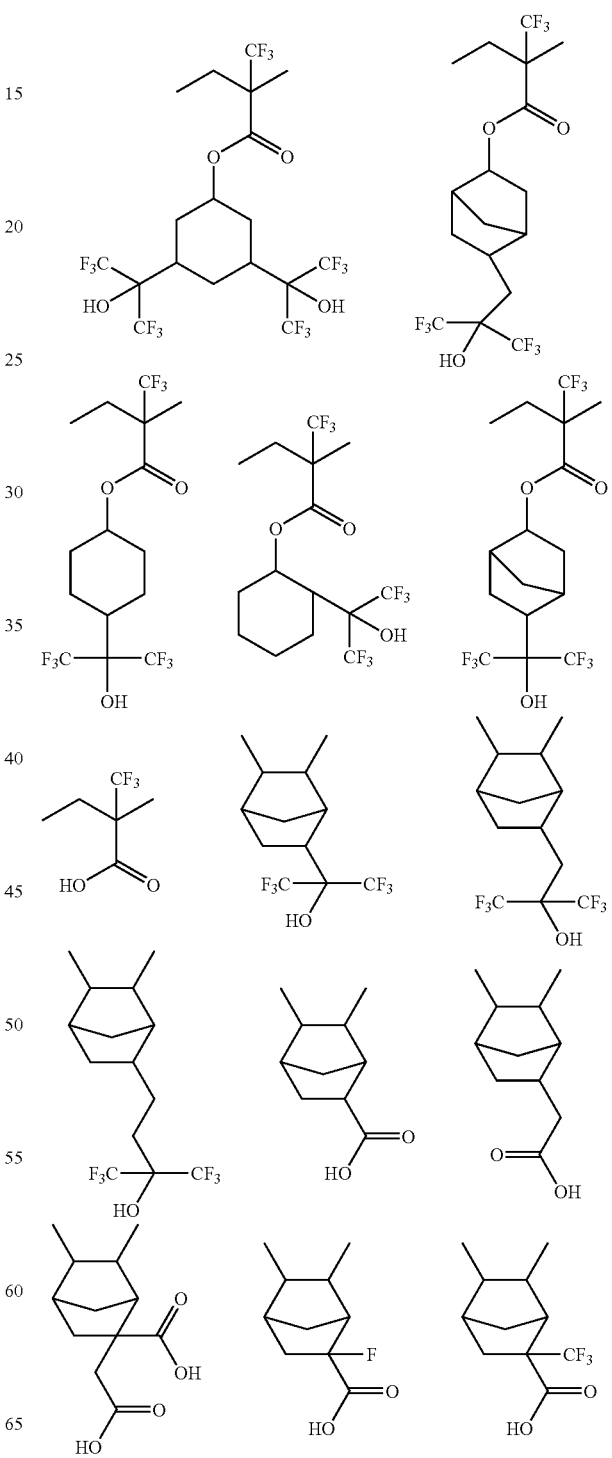

-continued
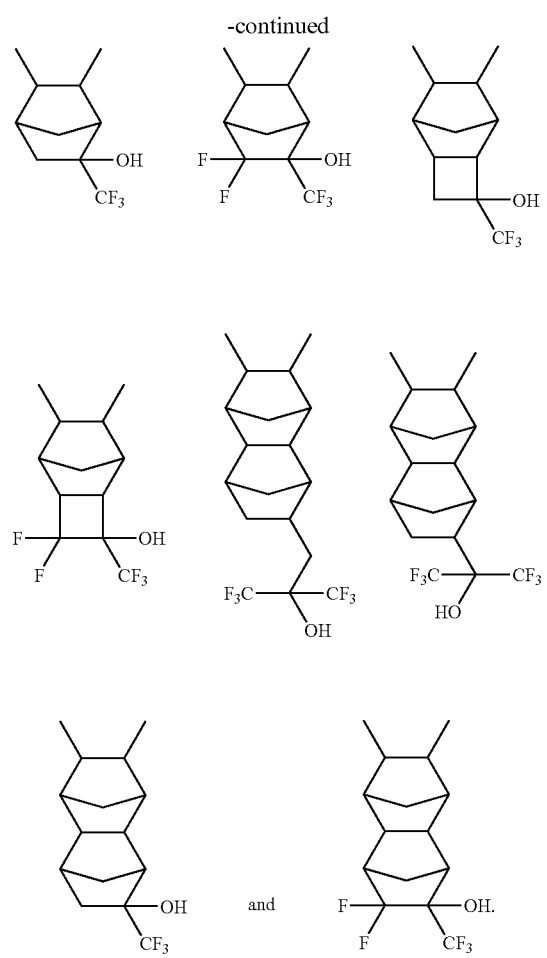
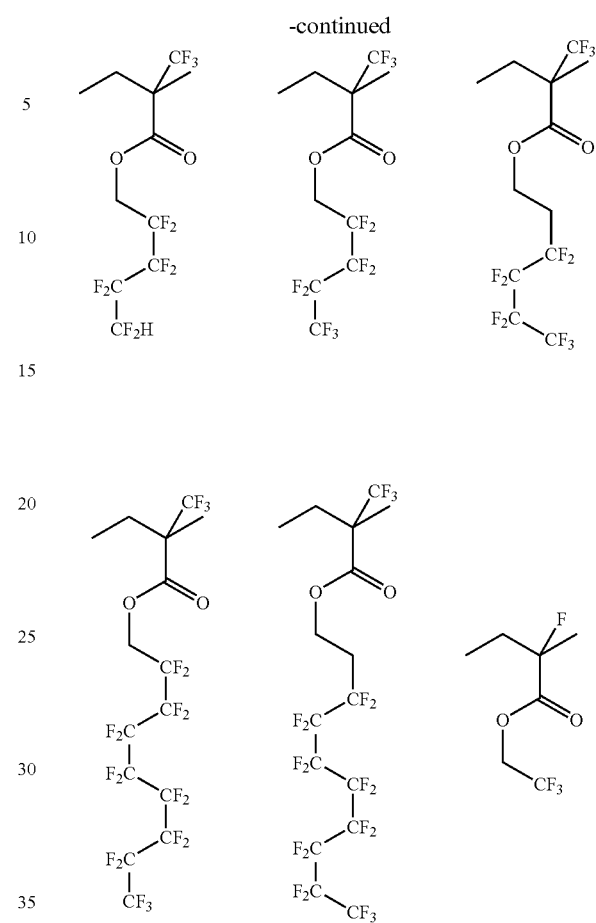
15. The resist protective coating material of claim 2 wherein the repeat unit (D) is selected from the group consisting of units having the following formulae:
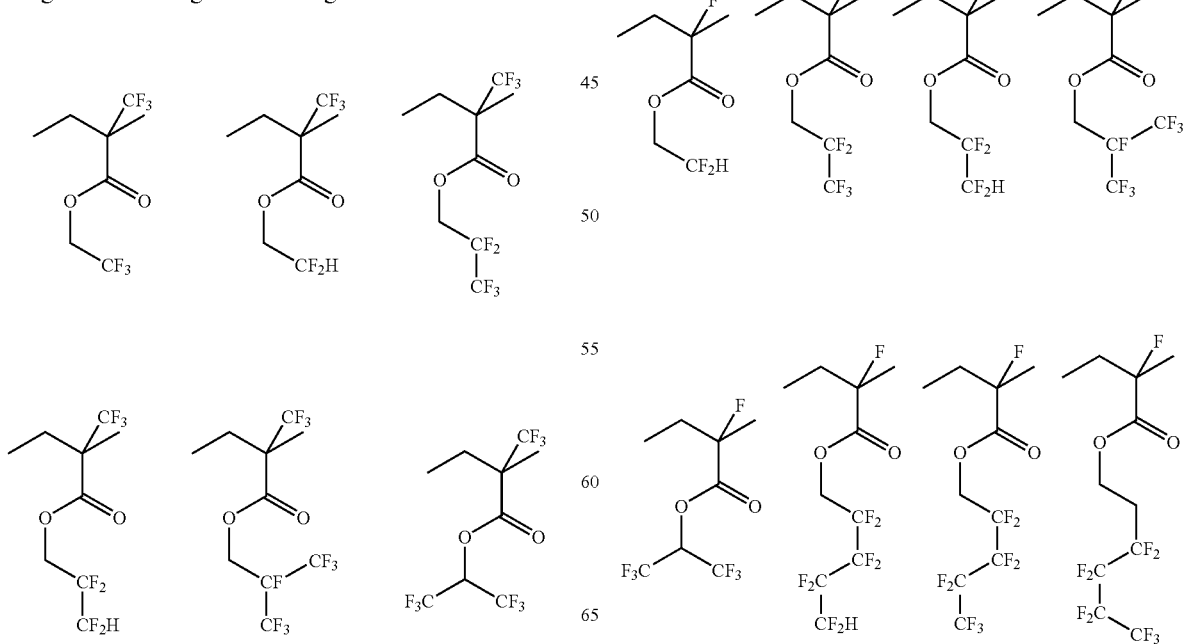

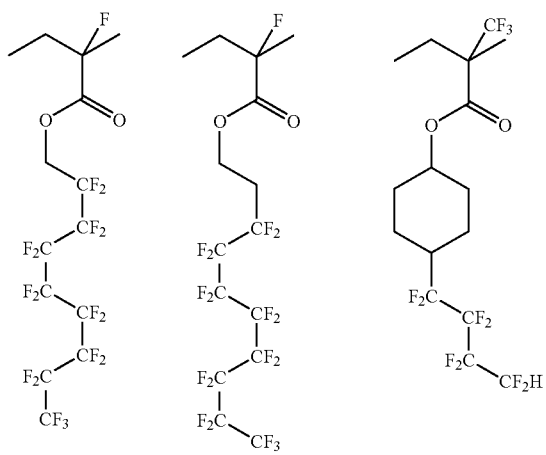
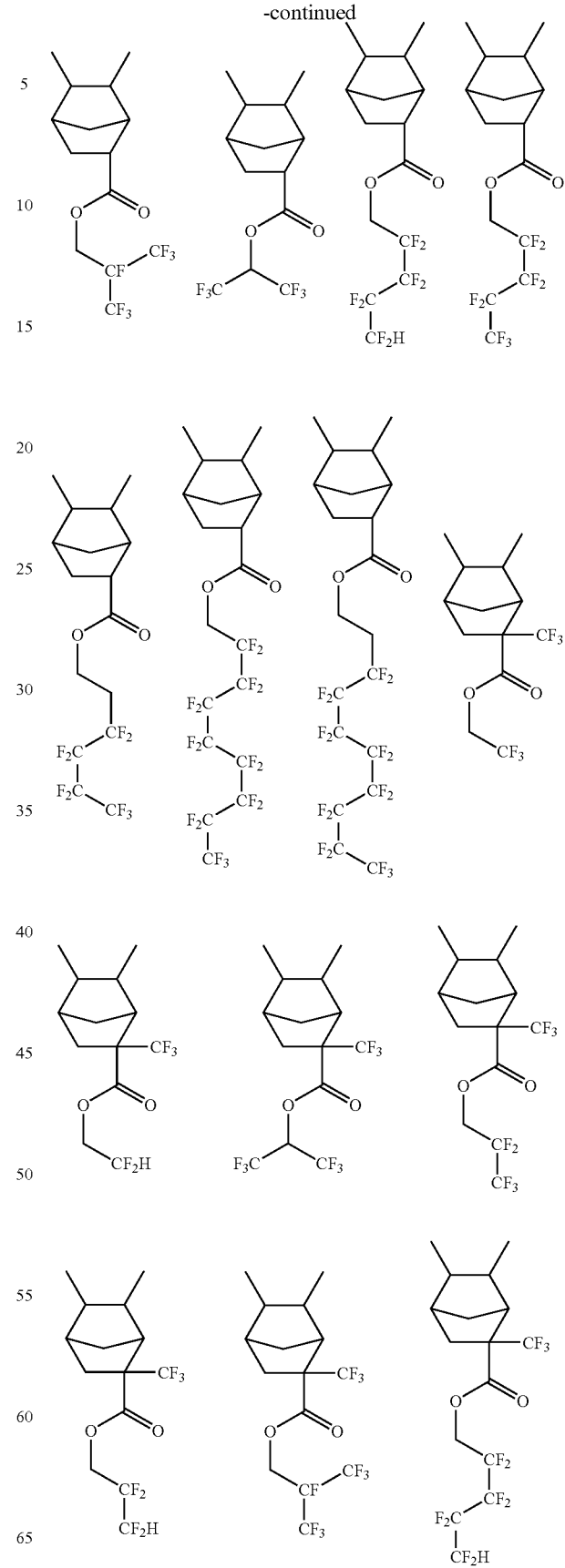

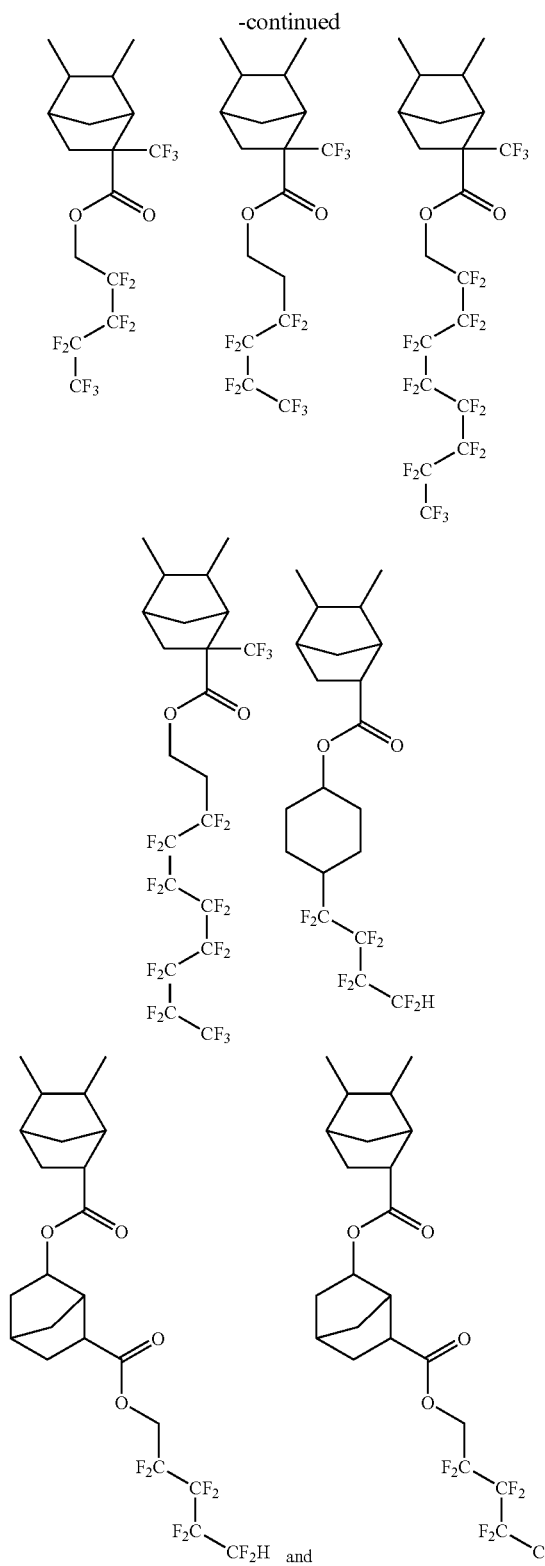

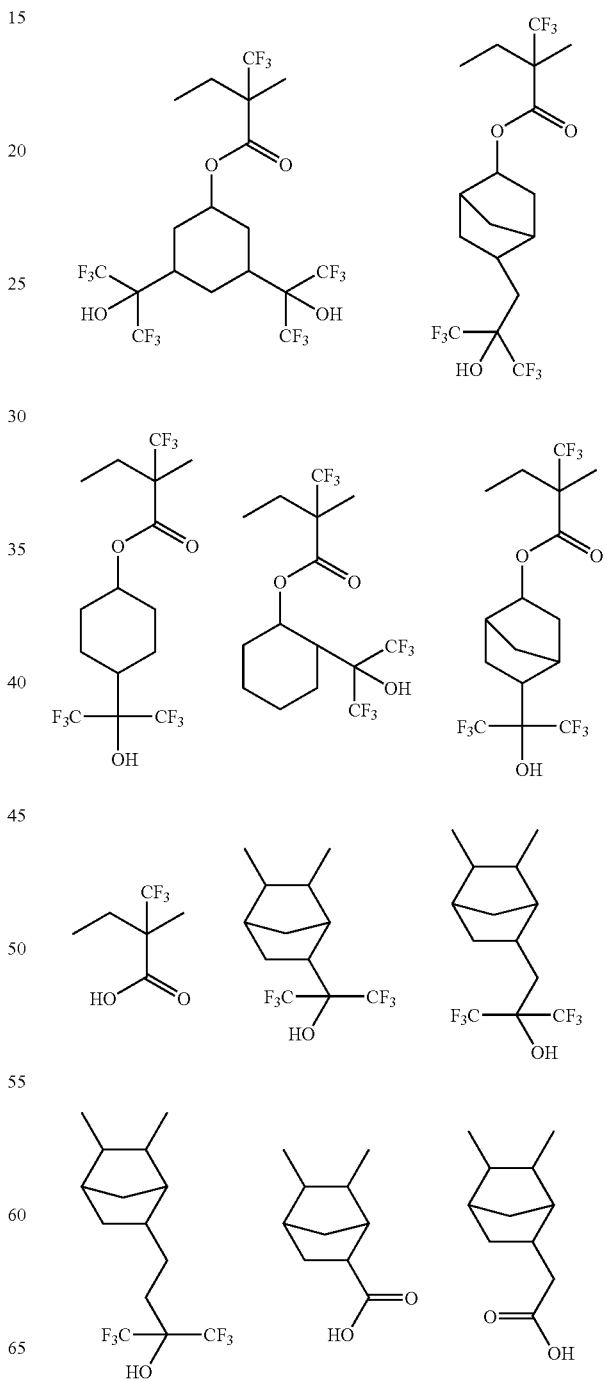

16. The process of claim 11, wherein the exposing step includes exposing the layer structure to light having a wavelength in the range of 180 to 250 nm through a projection lens while keeping water between the projection lens and the wafer.

17. The process of claim 11, wherein the developing step is to develop the photoresist layer and strip the protective coating of resist overlay material at the same time, using a liquid alkaline developer.

18. The process of claim 11, further comprising the step of stripping the protective coating using an organic solvent after the exposing step, and then developing the photoresist layer using a liquid alkaline developer.

19. The process of claim 9 wherein the repeat unit (C) is selected from the group consisting of units having the following formulae:

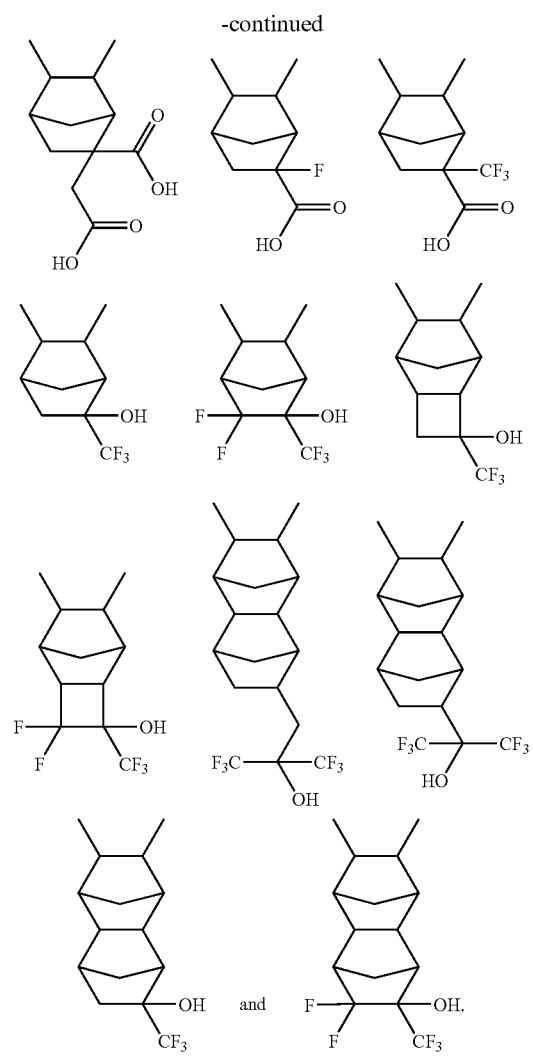
20. The process of claim 9 wherein said polymer further has copolymerized therein repeat unit (D) having fluoroalkyl groups selected from the group consisting of units having the following formulae:
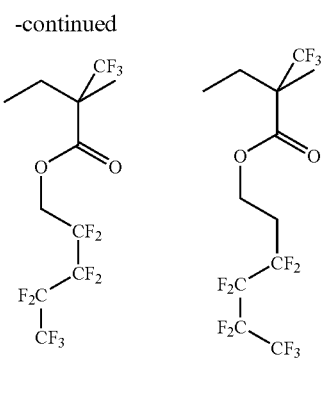
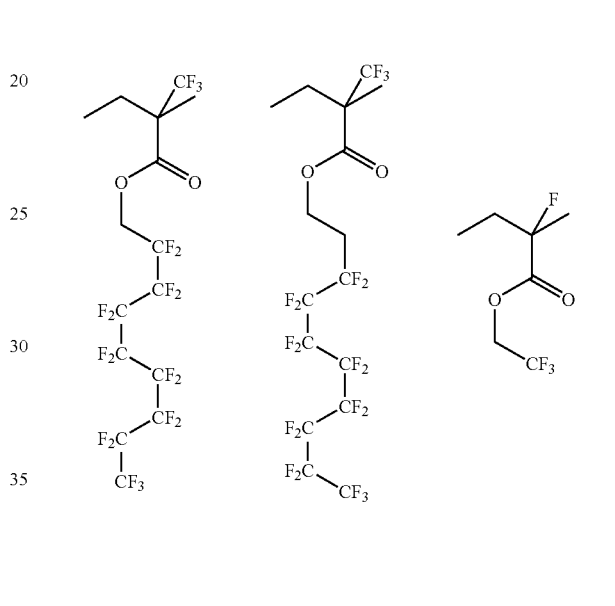
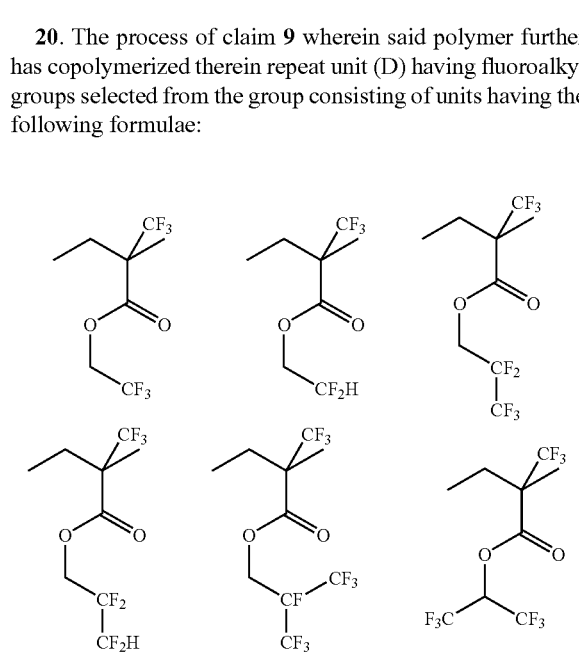
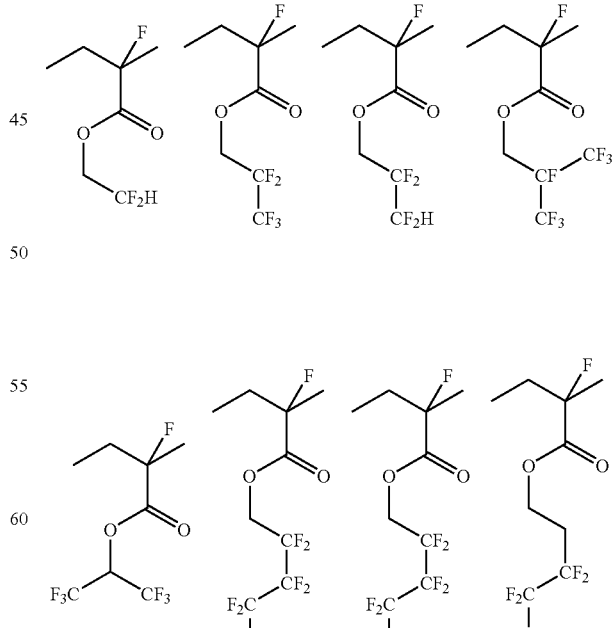

-continued
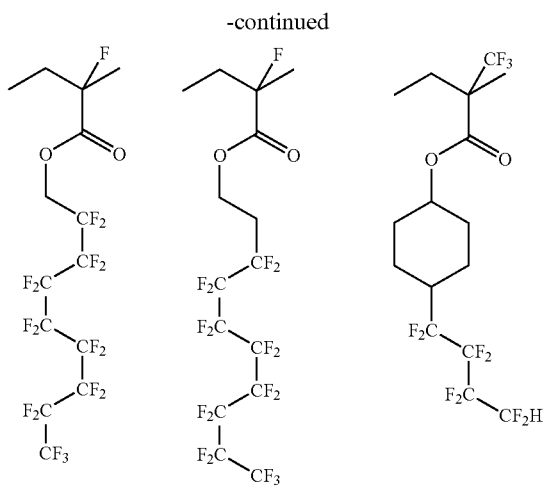
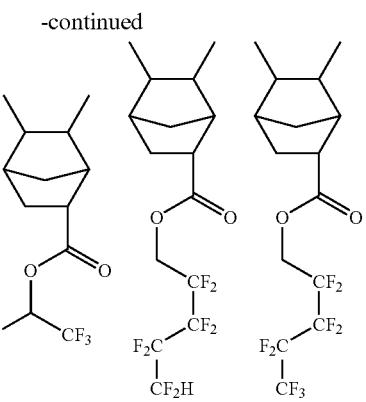
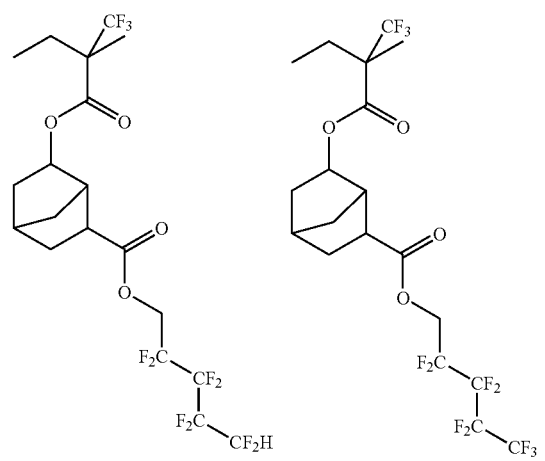
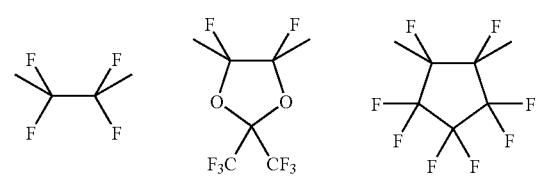
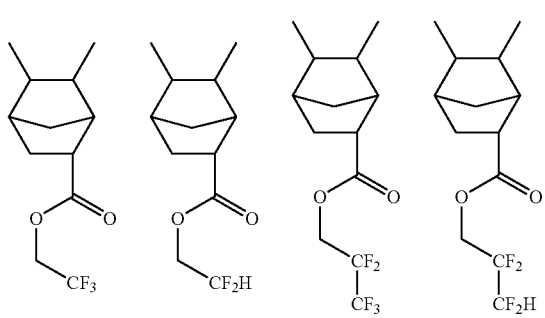
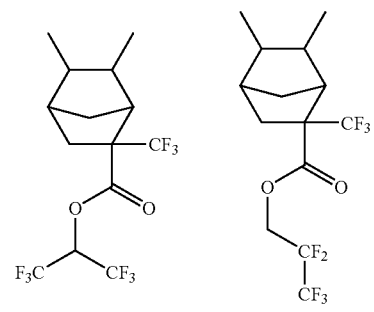

-continued
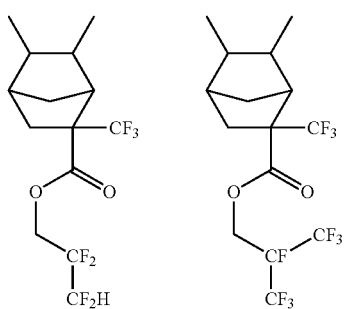
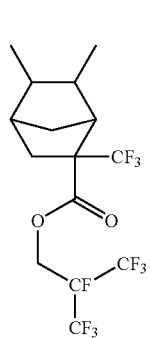
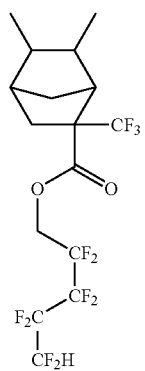
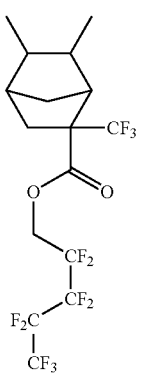
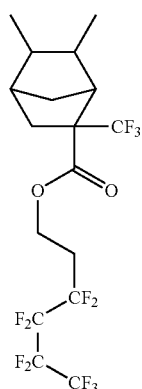
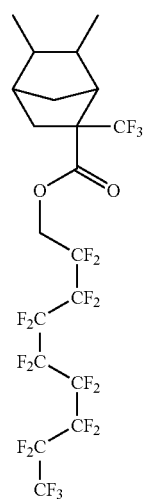
-continued
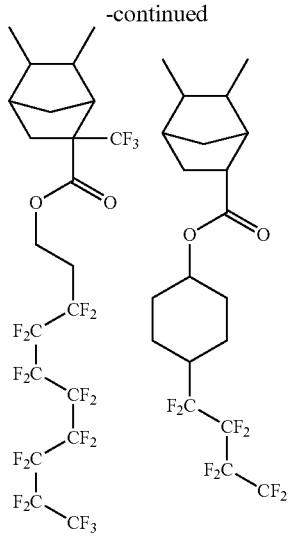
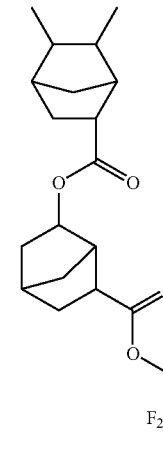
* * * * *